United States Patent [19]

Imai

[11] Patent Number: 6,117,598
[45] Date of Patent: Sep. 12, 2000

[54] SCANNING EXPOSURE METHOD WITH ALIGNMENT DURING SYNCHRONOUS MOVEMENT

[75] Inventor: Yuji Imai, Tokyo, Japan

[73] Assignee: Nikon Corporation, Tokyo, Japan

[21] Appl. No.: 09/196,157

[22] Filed: Nov. 20, 1998

[30] Foreign Application Priority Data

Nov. 25, 1997 [JP] Japan .................................. 9-339349

[51] Int. Cl.⁷ ...................................................... G03F 9/00
[52] U.S. Cl. .............................. 430/22; 430/30; 430/296
[58] Field of Search ................................ 430/22, 30, 296

[56] References Cited

U.S. PATENT DOCUMENTS

| | | | |
|---|---|---|---|
| 5,448,332 | 9/1995 | Sakakibara et al. | 355/53 |
| 5,737,063 | 4/1998 | Miyachi | 355/53 |
| 5,879,842 | 3/1999 | Okino | 430/22 |
| 5,969,800 | 10/1999 | Makinouchi | 355/53 |

FOREIGN PATENT DOCUMENTS

| | | |
|---|---|---|
| 07161614 | 6/1995 | Japan . |
| 08037150 | 2/1996 | Japan . |
| 08064506 | 3/1996 | Japan . |
| 10270303 | 10/1998 | Japan . |
| 10340853 | 12/1998 | Japan . |
| 11176746 | 7/1999 | Japan . |

Primary Examiner—Christopher G. Young
Attorney, Agent, or Firm—Oliff & Berridge, PLC

[57] ABSTRACT

With a scanning type exposure apparatus of the present invention, information of a target surface for alignment of a sensitive substrate in relation to the direction of an optical axis of a projection system is adjusted in accordance with at least one of a movement mode of a mask and a movement mode of the sensitive substrate, and based on reference information stored in a storage device, and scanning exposure is performed while aligning a surface to be exposed of the sensitive substrate and the target surface. Alternatively, an image formation surface of a pattern image of the mask is adjusted and scanning exposure is performed by aligning the image formation surface of the pattern image of the mask and a surface to be exposed of the sensitive substrate, thus enabling pattern transfer to be performed at a high exposure accuracy.

20 Claims, 13 Drawing Sheets

SCANNING EXPOSURE METHOD WITH ALIGNMENT DURING SYNCHRONOUS MOVEMENT

BACKGROUND OF THE INVENTION

1. Field of the Invention

The present invention relates to a scanning exposure method and a scanning type exposure apparatus, and more particularly to a scanning exposure method used when manufacturing semiconductor elements, liquid crystal display elements, thin-film magnetic head, or the like by a lithographic process, and to a scanning type exposure apparatus applicable to this exposure method.

This application is based on Japanese Patent Application No. Hei 9-339349, the contents of which are incorporated herein by reference.

2. Background Art

Heretofore, with the lithographic process for manufacturing semiconductor elements or liquid crystal display elements or the like, a projection exposure apparatus is used which transfers a pattern formed on a mask or reticle (referred to hereunder in general as a reticle) onto a substrate of for example a wafer or glass plate which has been painted with a photoresist or the like (suitably referred to hereunder as a sensitive substrate or a wafer), by means of a projection optical system. For this type of apparatus, for example in the manufacturing process for semiconductor elements, heretofore there has principally been used a reduction projection type exposure apparatus of a stationary exposure type (also referred to as a step-and-repeat system) which repeatedly switches between a stepping operation for positioning a wafer stage on which is mounted a wafer serving as a sensitive substrate at a predetermined exposure position by moving a predetermined amount in the two dimensional X, Y direction, and an exposure operation where while positioned, a pattern of a reticle is transferred to a shot area on the sensitive substrate by means of a projection optical system. However with the yearly increase in the amount of integration of semiconductors and the accompanying increase in detail of circuit patterns, then with the performance of exposure apparatus, there is the requirement for even higher resolving powers, and increased exposure accuracy. As an exposure apparatus which addresses these requirement, recently a scanning type exposure apparatus, for example a step-and-scan type scanning type exposure apparatus has gained attention. With this apparatus, a reticle stage holding a reticle, and a wafer stage are simultaneously moved in a predetermined scanning direction with respect to a projection optical system while illuminating a predetermined slit shaped area on the reticle with illumination light. As a result patterns inside the slit area on the reticle are transferred one by one onto the wafer by mean of a projection optical system, thereby transferring the reduction image of the whole surface of the reticle pattern onto a shot area of the wafer.

With such a scanning type exposure apparatus, from the view point of improving throughput, it is general to adopt a scanning exposure method in which successive reticle patterns are transferred to a plurality of shot areas on the wafer while reciprocally moving the reticle stage in the scanning direction.

Furthermore, with the conventional scanning type exposure apparatus, the position of a best image formation surface of the projection optical system is measured beforehand using a predetermined sensor, without moving the reticle and the wafer stage in a synchronous manner, and focus levelling control during scanning exposure is performed using a focus sensor, in order to make the area to be exposed of the wafer surface (the slit shape area on the wafer corresponding to the illuminated area on the reticle) coincide with the position of the best image formation surface (more accurately, within the focal depth range of the best image formation surface).

With the conventional scanning type exposure apparatus, as described above the position of the best image formation surface is fixed as the target position in the optical axis direction of the projection optical system with which the area to be exposed of the wafer surface must be aligned, and focus levelling control is performed during scanning exposure.

However, with the scanning type exposure apparatus, it has recently become apparent that because in order to perform scanning exposure while synchronously moving the reticle and the wafer, focus control is performed with a certain position of the best image formation surface measured as a target value, then it is not always possible to make this perfectly coincide with the target surface for aligning the area to be exposed of the wafer. This is presumably attributable to inclination (deformation) attributed to the occurrence of vibration or movement of the centre of gravity position in the exposure apparatus body during synchronous movement, to the limits of the control response at the time of focusing due to mechanical performance of the stage drive system, and to the limits in alignment accuracy.

According to information of the present inventor obtained from the results of research, the amount of this non-coincidence differs for each apparatus. Furthermore this also differs due to the movement conditions of both stages, such as the movement direction of the reticle or the wafer or the positional change of the reticle (reticle stage) and the wafer (wafer stage) during synchronous movement, and the movement speed of the reticle stage and the wafer stage.

With the exposure accuracy obtained heretofore, the focus error arising due to the abovementioned sources is of a degree which can be disregarded. However with future requirements for exposure accuracy, it is expected that these will gradually become more stringent. Hence development of a scanning exposure method and scanning type exposure apparatus which can reduce the focus error and levelling error attributable to the movement conditions of the wafer stage or the reticle stage as described above, has now become a pressing need.

SUMMARY OF THE INVENTION

In view of the above situation, it is an object of the present invention to provide a scanning exposure method which can perform highly accurate control of focus and levelling during scanning exposure.

Furthermore, another object of the present invention is to provide a scanning type exposure apparatus which can perform highly accurate focus control during scanning exposure.

In order to achieve the above objects, each of the aspects of the present invention comprises the following construction. Although the following explanations includes the same reference numbers as those attached in the Figures for references, each of the elements in the following explanation are not limited to those disclosed in the Figures.

With the first aspect of the present invention, a scanning exposure method wherein a pattern formed on a mask (R) is transferred onto a sensitive substrate (W) by means of a projection system (PL) while synchronously moving the mask (R) and the sensitive substrate (W), is provided. The method comprises adjusting information related to a target surface for alignment of the sensitive substrate (W) in an optical axis (AX) direction of the projection system (PL) in accordance with a mode of synchronous movement of at least one of the mask (R) and the sensitive substrate (W), and aligning a surface to be exposed of the sensitive substrate (W) with the target surface during scanning exposure.

With the scanning method of the first aspect, the information of the target surface for alignment of the sensitive substrate (W) in relation to the optical axis direction of the projection system is adjusted in accordance with a mode of synchronous movement of at least one of the mask and the sensitive substrate, and the position of the surface to be exposed of the sensitive substrate and of the target surface are aligned. In this way during synchronous movement, the conjugate relationship related to the projection system between the area to be irradiated of the mask by the illumination light for exposure (referred to hereunder as the area to be irradiated of the mask) and the area to be exposed of the surface to be exposed of the sensitive substrate (referred to hereunder as the area to be exposed of the sensitive substrate) is maintained. Consequently, with the scanning exposure method of aspect 1, the pattern formed on the mask can be transferred onto the sensitive substrate by means of the projection system, while maintaining a high exposure accuracy.

According to the above scanning exposure method, since the information of a target surface for alignment of a sensitive substrate in relation to the direction of the optical axis of the projection system is adjusted in accordance with at least one of the movement mode of a mask and the movement mode of a sensitive substrate, and since scanning exposure is performed while aligning a surface to be exposed of the sensitive substrate and the target surface, an image formation surface of a pattern image of the mask is adjusted and scanning exposure is performed by aligning the image formation surface of the pattern image of the mask and a surface to be exposed of the sensitive substrate. Hence pattern transfer can be performed at a high exposure accuracy.

With the second aspect of the present invention, a scanning exposure method wherein a pattern formed on a mask (R) is transferred onto a sensitive substrate (W) by means of a projection system (PL) while synchronously moving the mask (R) and the sensitive substrate (W), is provided. The method comprises adjusting an image formation surface of a pattern image in accordance with a mode of synchronous movement of at least one of the mask (R) and the sensitive substrate (W), and aligning the image formation surface of the pattern image of the mask (R) with a surface to be exposed of the sensitive substrate (W).

With the scanning exposure method according to the second aspect, the image formation surface of the pattern image of the mask is adjusted by adjusting the projection system in accordance with a mode of synchronous movement of at least one of the mask and the sensitive substrate, and the image formation surface of the pattern image of the mask (R) and the surface to be exposed of the sensitive substrate are aligned. In this way during synchronous movement, the conjugate relationship related to the projection system between the area to be irradiated of the mask and the area to be exposed of the sensitive substrate is maintained. Consequently, with the scanning exposure method of aspect 2, the pattern formed on the mask can be transferred onto the sensitive substrate by means of the projection system, while maintaining a high exposure accuracy.

The first and second aspect of the invention can be combined. That is to say, with a scanning exposure method wherein a pattern formed on a mask (R) is transferred onto a sensitive substrate (W) by means of a projection system (PL) while synchronously moving the mask (R) and the sensitive substrate (W), scanning can also be performed while aligning the surface to be exposed of the sensitive substrate (W) and the position of the target surface, and while aligning the image formation surface of the pattern image of the mask (R) and the surface to be exposed of the sensitive substrate (W), by adjusting the information of the target surface for aligning the sensitive substrate (W) in relation to an optical axis (AX) direction of the projection system (PL), and adjusting the image formation surface of the pattern image of the mask (R) in accordance with a mode of synchronous movement of at least one of the mask (R) and the sensitive substrate (W). In this case also it is possible to scan-expose while maintaining the conjugate relationship related to the projection system between the area to be irradiated of the mask and the area to be exposed of the sensitive substrate, and hence the pattern formed on the mask can be transferred onto the sensitive substrate by means of the projection system, while maintaining a high exposure accuracy.

With the scanning exposure method of the first aspect or the second aspect of the present invention, when during the synchronous movement, at least one of the area to be irradiated of the mask and the area to be exposed of the sensitive substrate becomes out of perpendicular with the optical axis of the projection system due to distortion or the like of the mask member or the sensitive substrate, then preferably as with the invention of aspect 3, the scanning exposure is again performed while adjusting the incline of the sensitive substrate (W) with respect to the optical axis (AX) of the projection system (PL).

With the third aspect of the present invention, since with the synchronous movement, at some point in time the mask and the sensitive substrate are moved in parallel, then in the case where at least one of the area to be irradiated of the mask and the area to be exposed of the sensitive substrate becomes out of perpendicular with the optical axis of the projection system, by adjusting the incline of the sensitive substrate with respect to the optical axis direction of the projection system, both the area to be irradiated of the mask and the area to be exposed of the sensitive substrate can be made perpendicular to the optical axis of the projection system. Consequently, with the third aspect of the present invention, the pattern formed on the mask can be transferred onto the sensitive substrate by means of the projection system, at a high exposure accuracy while maintaining the conjugate relationship related to the projection system, between the area to be irradiated of the mask, and the area to be exposed of the sensitive substrate.

With the scanning exposure method of the first or second aspect, various modes can be considered for the modes of the synchronous movement. However as with the forth aspect of the present invention, at least one of the movement direction and the movement speed of the mask (R) can be considered as the mode of the synchronous movement. Here since the movement direction of the mask (R) is determined by the initial position of the synchronous movement of the mask (R), the initial position of the synchronous movement of the mask (R) can also be treated as a mode of the synchronous movement. Furthermore, as with the fifth aspect of the present invention, it is possible to consider at least one of the movement direction and the movement speed of the wafer (W) as a mode of the synchronous movement.

As mentioned above, with the conventional method, the degree of deviation from the conjugate relationship related to the projection system between the area to be irradiated of the mask and the area to be exposed of the sensitive substrate differs depending on the movement direction or the movement speed of the mask or the sensitive substrate. Consequently with the scanning exposure method of the fourth or fifth aspect of the present invention, since adjustment is performed so that the conjugate relationship related to the projection system between the area to be irradiated of the mask and the area to be exposed of the sensitive substrate corresponding to the mode of the synchronous movement for the movement direction or the movement speed of the mask or the sensitive substrate is maintained, the pattern formed on the mask can be transferred onto the sensitive substrate by means of the projection system, at a high exposure accuracy.

With the scanning exposure method of the first aspect, various information can be considered for the information of the target surface. However as with the sixth aspect of the present invention, the information of the target surface may be the information corresponding to the position of the mask (R) during the synchronous movement. Furthermore, with the seventh aspect of the present invention, the information of the target surface may be the information corresponding to the position of the sensitive substrate (W) during the synchronous movement.

As mentioned above, for each position of the area to be irradiated of the mask, the dependency with respect to the movement direction and the movement speed of the mask differs. Moreover, for each position of the area to be exposed of the sensitive substrate, the dependency with respect to the movement direction and movement speed of the sensitive substrate differs. Consequently with the scanning exposure method of the sixth and seventh aspect, the information of the target surface is adjusted in accordance with the position of the mask or the sensitive substrate, and scanning exposure is performed while aligning the surface to be exposed of the sensitive substrate and the position of target surface. Hence the pattern formed on the mask can be transferred onto the sensitive substrate by means of the projection system, at a high exposure accuracy.

The degree of deviation from the conjugate relationship related to the projection system between the area to be irradiated of the mask and the area to be exposed of the sensitive substrate, in general differs for each scanning type exposure apparatus. This is because of variations in the components making up the apparatus and because variations in assembly accuracy naturally occur between apparatus. Consequently details of the attributes of any deviation from the conjugate relationship related to the projection system between the area to be irradiated of the mask and the area to be exposed of the sensitive substrate, are not something which can be determined at the time of designing the apparatus.

Therefore, with the eighth aspect of the present invention, preferably adjustment information for performing the adjustment in accordance with a mode of synchronous movement of at least one of the mask (R) and the sensitive substrate (W), is collected prior to exposing the sensitive substrate (W).

With the scanning exposure method of the eighth aspect, since adjustment of the positional relationship corresponding to the movement mode of the mask or the sensitive substrate measured at the time of synchronous movement is performed based on the collected adjustment information, the pattern formed on the mask can be ideally transferred onto the sensitive substrate by means of the projection system, at a high exposure accuracy.

For the adjustment information in the scanning exposure method of the eighth aspect, then as the ninth aspect of the present invention, this may be reference information for each movement direction of the mask (R), related to the target surface for alignment of the surface to be exposed of the sensitive substrate (W) in relation to the optical axis (AX) direction of the projection system (PL), for each synchronous movement direction of the mask (R).

Furthermore, with the collection of the adjustment information in the scanning exposure method of the eighth aspect, then for example as with the tenth aspect of the present invention, a predetermined mask ($R_T$) is moved in accordance with the synchronous movement direction, and information related to the projection image of the pattern of the predetermined mask ($R_T$) is obtained at a plurality of positions in the optical axis (AX) direction of the projection system (PL), and the reference information for each of the synchronous movement directions is determined based on the obtained information related to the projection image.

With the scanning exposure method of the tenth aspect, since the projection image of the pattern of the mask is formed under the same conditions as at the time of device manufacture, and this projection image is measured, the change in the projection image due to the movement mode of the mask which is the same as at the time of device manufacture is obtained. Consequently with the scanning exposure method of the tenth aspect, it is possible reliably obtain the adjustment information corresponding to the movement mode of the mask at the time of device manufacture, and hence the pattern formed on the mask can be ideally transferred onto the sensitive substrate by means of the projection system, at a high exposure accuracy adapted to the change of the movement mode of the mask.

As with the eleventh aspect of the present invention, preferably a plurality of predetermined patterns are formed on a predetermined mask (R) along the synchronous movement direction of the mask ($R_T$).

With the scanning exposure method of the tenth aspect, various methods can be considered for collection of the information related to the projection image of the pattern of the predetermined mask ($R_T$). However as with the twelfth aspect of the present invention, preferably the information related to the projection image of the pattern of the predetermined mask ($R_T$) is obtained by transferring the pattern of the predetermined mask ($R_T$) onto a predetermined sensitive substrate (W), and measuring the pattern which has been transferred onto the predetermined sensitive substrate (W).

With the scanning exposure method of the twelfth aspect, since the projection image of the pattern of the mask is formed under the same conditions as at the time of device manufacture, and the pattern is transferred to the sensitive substrate and the transferred pattern then measured, the relationship between the surface to be exposed of the sensitive substrate and the projection image position due to the movement mode of the mask and the movement mode of the sensitive substrate which are the same as at the time of device manufacture is obtained. Consequently, with the scanning exposure method of the twelfth aspect, it is possible reliably obtain the adjustment information corresponding to the movement mode of the mask and the movement mode of the sensitive substrate at the time of device manufacture, and hence the pattern formed on the mask can be ideally transferred onto the sensitive substrate by means of the projection system, at a high exposure accuracy adapted to the change of the movement mode of the mask and the movement mode of the sensitive substrate.

With the scanning exposure method of the twelfth aspect, various methods can be considered for the method of transfer of the pattern of the predetermined mask to the predetermined sensitive substrate. However for example as with the thirteenth aspect of the present invention, preferable this is performed by successively performing scanning exposure in various movement directions at each of the plurality of positions in the optical axis (AX) direction of the projection system (PL).

With the scanning exposure method of the thirteenth aspect, the position of a best focus surface corresponding to the movement mode of the mask and the movement mode of the sensitive substrate which are the same as at the time of device manufacture can be accurately measured, and the adjustment information more accurately obtained. Hence the pattern formed on the mask can be ideally transferred onto the sensitive substrate by means of the projection system, at a high exposure accuracy adapted to the change of the movement mode of the mask and the movement mode of the sensitive substrate.

With the scanning exposure method of the ninth aspect, various movement directions can be variously considered for the movement direction. However as with the fourteenth aspect of the present invention, this can be a first direction and a second direction opposite to the first direction.

With the fifteenth aspect of the present invention, a scanning type exposure apparatus (100) which transfers a pattern formed on a mask (R) onto a sensitive substrate (W) by means of a projection system (PL) while synchronously moving the mask (R) and the sensitive substrate (W) comprises: a substrate stage (18) which holds the sensitive substrate (W), and which is movable in a first direction and a second direction different from the first direction; a storage device which stores first reference information (52) related to a target position for alignment of a surface to be exposed of the sensitive substrate (W) in an optical axis (AX) direction of the projection system (PL) when the sensitive substrate (W) is exposed while moving the substrate stage (18) along the first direction, and second reference information (54) related to a target position for alignment of a surface to be exposed of the sensitive substrate (W) in the optical axis (AX) direction of the projection system (PL) when the sensitive substrate (W) is exposed while moving the substrate stage (18) along the second direction; a detection system (40, 42) which detects positional information of the sensitive substrate (W) related to the optical axis (AX) direction at a detection point on the sensitive substrate (W); and a substrate drive device (19, 21), electrically connected with the storage device and the detection system, which sets the surface to be exposed of the sensitive substrate (W) based on information stored in the storage device (50) and the detection results of the detection system (40, 42), during synchronous movement.

With the scanning type exposure apparatus of the fifteenth aspect, using first reference information and second reference information stored in the storage device, and the position information of the sensitive substrate surface related to the optical axis direction at the detection point detected by the detection system, the substrate drive device sets the surface to be exposed of the sensitive substrate based on the information stored in the storage device and the detection results from the detection system.

That is to say, when the sensitive substrate is scan-exposed while moving the substrate stage along the first direction, alignment of the surface to be exposed of the sensitive substrate with respect to the optical axis direction of the projection system is performed using the first reference information, and when the sensitive substrate is scan-exposed while moving the substrate stage along the second direction, alignment of the surface to be exposed of the sensitive substrate with respect to the optical axis direction of the projection system is performed using the second reference information.

Consequently, with the scanning type exposure apparatus of the fifteenth aspect of the pattern formed on the mask can be ideally transferred onto the sensitive substrate by means of the projection system, at a high exposure accuracy.

With the scanning type exposure apparatus of the present invention, scanning exposure is performed while changing the target position for alignment of the sensitive substrate with respect to the direction of the optical axis of the projection system during scanning exposure, based on the reference information stored in the storage device. Therefore the area to be exposed of the sensitive substrate is maintained at the best focus surface, so that pattern transfer can be performed at a high exposure accuracy.

In the scanning type exposure apparatus of the fifteenth aspect, various movements can be considered for the movement for alignment of the surface to be exposed of the sensitive substrate (W). However as disclosed in sixteenth aspect of the present invention, with the position information detected by the detection system (40, 42) a deviation is made between the position of the sensitive substrate (W) surface related to the optical axis (AX) direction, and a target position, and the substrate drive device modifies the target position of the detection system based on the information stored in the storage device (50) to thereby realize scanning exposure. Furthermore, as with the seventeenth aspect of the present invention, the substrate drive device (19, 21) corrects the position information detected by the detection system (40, 42) based on the information (52, 54) stored in the storage device (50), and sets the surface to be exposed of the sensitive substrate (W) based on the corrected position information to thereby realize scanning exposure.

DESCRIPTION OF THE PREFERRED EMBODIMENTS

First embodiment

As follows is a description of a scanning type exposure apparatus and a scanning exposure method of a first embodiment of the present invention, with reference to FIG. 1 through FIG. 8.

Figure 1:
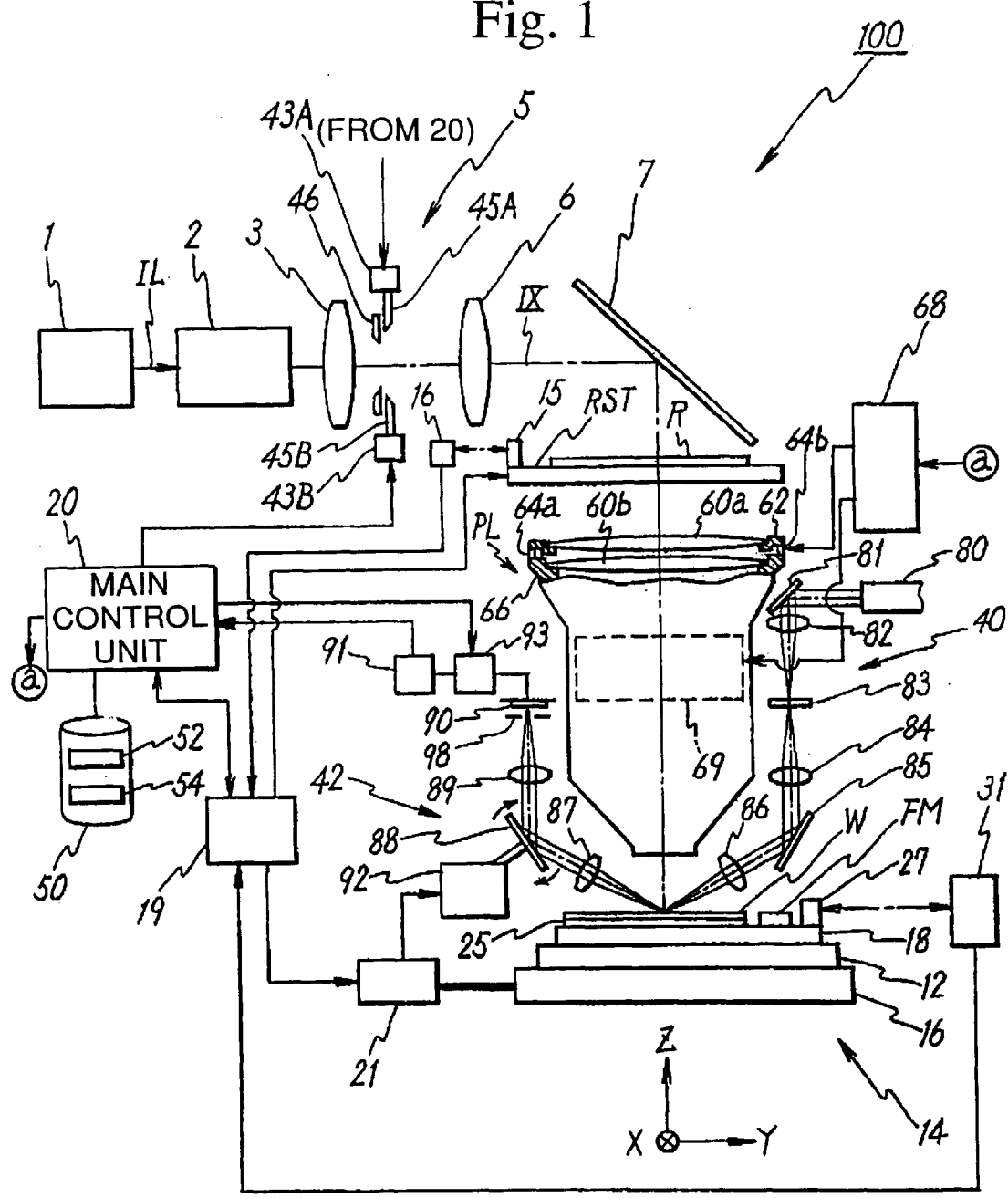
FIG. 1 is a diagram showing a schematic construction of a scanning type exposure apparatus according to a first embodiment.

FIG. 1 shows a schematic construction of a scanning type exposure apparatus 100 according to the first embodiment. The scanning type exposure apparatus 100 is a projection exposure apparatus for the so called step-and-scan exposure method.

The scanning type exposure apparatus 100 is provided with for example; an illumination system including a light source 1 and an illumination optical system (2, 3, 5~7), a reticle stage RST serving as a mask stage for holding a reticle R as a mask, a projection optical system PL, an XY stage apparatus 14 provided with a substrate table 18 serving as a substrate stage for holding a wafer W serving as an exposure substrate and moving in the two dimensional XY direction in an XY plane, and a control system including a storage device 50 in which is stored first reference information 52 and second reference information 54. Here the first reference information 52 is information for reference at the time of scanning exposure while moving the wafer W in a +Y direction (to the right in the plane of the paper in FIG. 1), while the second reference information 54 is information for reference at the time of scanning exposure while moving the wafer W in the −Y direction (to the left in the plane of the paper in FIG. 1).

The illumination system comprises for example; the light source 1, an illumination intensity equalizing optical system 2 comprising collimator lens, a fly eye lens etc. (neither shown in FIG. 1), a relay lens 3, a reticle blind 5, a relay lens 6, and a downward reflecting mirror 7 (of these, the illumination optical system is made up of the illumination equalizing optical system 2, the relay lenses 3, 6, the reticle blind 5, and the downward reflecting mirror 7).

Here, to explain about the respective components constituting the illumination system together with their operation, illumination light IL serving as exposure light generated by the light source 1 passes through a shutter (not shown in FIG. 1), and is then converted by means of the illumination intensity equalizing optical system 2 into a beam with substantially uniform illumination intensity distribution. For the illumination light IL, excimer laser light such as for example KrF excimer laser light, ArF excimer laser light, or $F_2$ excimer laser light, or higher harmonics of a copper vapor laser or a YAG laser, or an emission line (g-line, i-line etc.) in the ultraviolet region from an ultra high voltage mercury lamp, X-rays, or a charged particle beam can be used.

The beam projected horizontally from the illumination intensity equalising optical system 2 reaches to the reticle blind 5 via the relay lens 3. The reticle blind 5 comprises a moveable blind having two moveable plates 45A, 45B (hereunder the moveable blind is suitably called "moveable blinds 45A, 45B"), and a fixed blind 46 to which is secured an aperture located in the vicinity of the moveable blinds 45A, 45B. Positioning surfaces of the moveable blinds 45A, 45B are conjugate with the pattern surface of the reticle R. The fixed blind 46 restricts the field of view bounded by the rectangular aperture by means of for example four knife edges, so that the vertical width of the rectangular aperture is defined by the moveable blinds 45A, 45B. By means of this, the width of a slit shape illumination area IAR (refer to FIG. 2) illuminating the reticle R can be set to a desired size. The movable blinds 45A, 45B are driven in the open and close directions by a movable blind drive mechanism 43A, 43B. The operation of the movable blind drive mechanism 43A, 43B is controlled by a main control unit 20 in accordance with masking information inside a file called a process program stored in a memory (not shown in FIG. 1).

The beam which has passed through the reticle blind 5, passes through the relay lens 6 to reach the downward reflecting mirror 7 and is here bent down in the vertical direction to illuminate the illumination area IAR portion of the reticle R on which is drawn a circuit pattern or the like.

The reticle R is fixed onto the reticle stage RST by for example vacuum clamping. The reticle stage RST is for location of the reticle R, and is constructed so as to be incrementally movable two dimensionally (in an X-axis direction, a Y-axis direction perpendicular to the X-axis direction, and in a rotation direction around a Z-axis perpendicular to the XY plane) in a plane perpendicular to an optical axis IX of the illumination optical system (coinciding with an optical axis AX of the projection optical system PL).

Furthermore, the reticle stage RST is moveable on a reticle base (not shown in FIG. 1) at a specified scanning speed in a predetermined scanning direction (here the Y-axis direction), by means of a reticle drive section (omitted from FIG. 1) comprising for example a linear motor. The reticle stage RST has a movement stroke such that the whole surface of the reticle R can at least intersect the optical axis IX of the illumination optical system.

On the reticle stage RST is secured a moving mirror 15 for reflecting a laser beam from a reticle laser interferometer (referred to hereunder as a reticle interferometer) 16. A position within the moving surface of the reticle stage RST is continually detected by the reticle interferometer 16 at a resolution of for example 0.5–1 nm approximately. Here in practice, a moving mirror having a reflecting surface perpendicular to the scanning direction (Y-axis direction) and a moving mirror having a reflecting surface perpendicular to the non scanning direction (X-axis direction) are provided on the reticle stage RST, and the reticle interferometer 16 is provided with one axis in the scanning direction and two axes in the non scanning direction. However in FIG. 1, this is representatively shown as the moving mirror 15 and the reticle interferometer 16.

Position information for the reticle stage RST from the reticle interferometer 16 is sent to a stage control system 19, and then via this to the main control unit 20. The stage control system 19 drives the reticle stage RST via a reticle drive section (omitted from FIG. 1) based on the position information for the reticle stage RST, in accordance with instructions from the main control unit 20.

Here, the initial position of the reticle stage RST is determined so that the reticle R is accurately positioned at a predetermined reference position by a reticle alignment system (not shown in FIG. 1), and hence the position of the reticle R is measured with sufficiently high accuracy by simply measuring the position of the moving mirror 15 with the reticle interferometer 16.

The projection optical system PL is positioned downwards in FIG. 1 of the reticle stage RST, and the direction of the optical axis AX (coinciding with the optical axis IX of the illumination optical system) is made the Z-axis direction. Here a refraction optical system comprising a plurality of lens elements positioned at predetermined spacing along the optical axis AX direction to give a double sided telecentric optical arrangement is used. The projection optical system PL is a reducing optical system having a predetermined projection magnification of for example ⅕ (or ¼). Therefore, when the illumination area IAR of the reticle R is illuminated by the illumination light IL from the illumination optical system, then due to the illumination light IL which has passed through the reticle R, a reduced image of the circuit pattern of the reticle R is formed by means of the projection optical system PL on the wafer W the surface of which has been painted with a photoresist.

The projection optical system PL comprises a plurality of lens elements 60*a*, 60*b* (only two shown in FIG. 1), having a common optical axis so as to give a double sided telecentric optical arrangement. Of the lens elements, the uppermost lens element 60*a* which is closest to the reticle stage RST is held by a ring shaped support member 62. The support member 62 is supported at three points by expandable and contractable drive elements, for example piezo elements 64*a*, 64*b*, 64*c* (the drive element 64*c* on the back side of the paper surface is not shown), and connected to a mirror tube portion 66. By means of the drive elements 64*a*, 64*b*, 64*c*, the three points on the periphery of the lens element 60*a* can be moved independently in the optical axis AX direction of the projection optical system PL. That is to say, the lens element 60*a* can be moved parallel along the optical axis AX in accordance with the displacement amount of the drive elements 64*a*, 64*b*, 64*c*, and at the same time can also be optionally inclined with respect to the plane perpendicular to the optical axis AX. Moreover, the voltage applied to the drive elements 64*a*, 64*b*, 64*c* is controlled by an image formation characteristic correction controller 68 based on a command from the main control unit 20. As a result the displacement amount of the drive elements 64*a*, 64*b*, 64*c* is controlled. Here in FIG. 1, the optical axis AX of the projection optical system PL coincides with the optical axis of the other lens elements (omitted from FIG. 1) other than the lens element 60*b* secured to the mirror tube portion 66.

Furthermore, with the present embodiment, an air tight chamber 69 is formed mutually between specific lens elements in the vicinity of a central portion in the optical axis direction of the projection optical system PL. The internal pressure of the air tight chamber 69 is adjusted by a pressure adjustment mechanism not shown in FIG. 1 (for example a bellows pump etc.). The pressure adjustment mechanism also is controlled by the image formation characteristic correction controller 68 based on a command from the main control unit 20, to thereby adjust the internal pressure of the air tight chamber 69.

Here, by movement or inclination of the lens element 60*a* in the optical axis AX direction the magnification of the projection optical system PL can be modified, and distortion and the image formation surface of the projection optical system PL can be modified. Moreover, by changing the internal pressure of the air tight chamber 69 inside the projection optical system PL the magnification and the image formation surface of the projection optical system PL can be modified. With the present embodiment, the image formation characteristic correction device for controlling the magnification, the distortion, and the image formation surface of the pattern image of the reticle R is primarily constructed by the image formation characteristic correction controller 68 for controlling the drive elements 64*a*, 64*b*, 64*c*, the displacement amount of the air tight chamber 69 and drive elements, and the internal pressure of the air tight chamber.

Furthermore, with the present embodiment, the relationship between the raising and lowering amount and the magnification change amount of the lens element 60*a* is determined beforehand by experiment, and stored in the memory inside the main control unit 20. At the time of correction, magnification correction is performed by computing the raising and lowering amount of the lens element 60*a* from the magnification corrected by the main control unit 20, and giving an instruction to the image formation characteristic correction controller 68 to drive the drive elements 64*a*, 64*b*, 64*c*. Here for the relationship between the raising and lowering amount and the magnification change amount of the lens element 60*a* an optical computation value may be used. In this case, the experimental step to obtain the relationship between the raising and lowering amount and the magnification change amount of the lens element 60*a* can be omitted.

As mentioned before, the lens element 60*a* closest to the reticle R is drivable. The lens element 60*a* is selected as one where the influence on the magnification and distortion characteristics is much easier to control than with the other lens elements. However, provided similar conditions are satisfied, the construction may be such that any of the lens elements can be moved for lens spacing adjustment, instead of the lens element 60*a*.

Similarly, with this embodiment, the relationship between the change in the internal pressure of the air tight chamber 69, and the magnification change is determined beforehand by experimentation, and stored in the memory inside the main control unit 20. Hence at the time of correction, magnification correction can also be performed by computing the variation amount in the internal pressure of the air tight chamber 69 from the magnification corrected by the main control unit 20, and giving an instruction to the image formation characteristic correction controller 68 to increase or decrease the internal pressure of the air tight chamber 69. Specifically, the magnification changes in proportion to the internal pressure of the air tight chamber 69. In this case also, the refractive index change due to a change in the internal pressure, and the deformation or movement of a lens element constituting a partition of an air tight section due to a change in the internal pressure can also be obtained by computing using simulation.

In addition, for example, a non spherical surface lens may be used for the lens element of one portion constituting the projection optical system PL, and this may be rotated. In this case, correction for so called rhombic shaped distortion is possible. Alternatively, a parallel flat surfaced plate may be provided within the projection optical system PL, and the image formation characteristic correction device made up of a mechanism for tilting and rotating this.

The XY stage apparatus 14 has a Y stage 16 which is movable on a base (not shown in the figure) back and forth along the Y-axis direction (in the left and right direction in FIG. 1) being the scanning direction, an X stage 12 which is movable on the Y stage 16 back and forth along an X-axis direction (the direction perpendicular to the page in FIG. 1)

perpendicular to the Y-axis direction, and a substrate table 18 provided on the X stage 12. Furthermore, a wafer holder 25 is mounted on the substrate table 18, and a wafer W serving as the sensitive substrate is held on the wafer holder 25 by vacuum clamping.

The substrate table 18 is mounted on the X stage 12, positionally located in the XY direction, and in a condition permitting movement and inclination in the Z-axis direction. In this respect, the substrate table 18 is supported by three axes (not shown in FIG. 1) at three different support points, and these three axes are moved independently in the Z-axis direction by a wafer drive unit 21. As a result, the surface position (the Z-axis position and the incline to the XY plane) of the wafer W held on the substrate table 18 is set to a desired condition.

On the substrate table 18 is secured a moving mirror 27 for reflecting a laser beam from a wafer laser interferometer (referred to hereunder as a wafer interferometer) 31. By means of the externally mounted wafer interferometer 31, a position within the XY surface of the substrate table 18 is continually detected at a resolution of for example 0.5~1 nm approximately.

Here in practice, a moving mirror having a reflecting surface perpendicular to the Y-axis direction being the scanning direction, and a moving mirror having a reflecting surface perpendicular to the X-axis direction being the non scanning direction are provided on the substrate table 18, and the wafer interferometer 31 is provided with one axis in the scanning direction and two axes in the non scanning direction. However in FIG. 1, this is representatively shown as the moving mirror 27 and the wafer interferometer 31. Position information (or speed information) for the substrate table 18 is sent to the stage control system 19, and then via this to the main control unit 20. The stage control system 19 controls the Y stage 16 and the X stage 12 via a wafer drive unit 21 (this includes all of the drive systems for the X stage 12 and the Y stage 16, and for the substrate table 18) based on the position information (or speed information), in accordance with instructions from the main control unit 20. Here the substrate drive device comprises the stage control system 19 and the wafer drive unit 21.

Furthermore, on the substrate table 18 is secured a reference mark plate FM on which is formed respective reference marks for base line measurement etc. for measuring a distance from the detection center of an alignment detection system of an off axis form (not shown in FIG. 1), to the optical axis of the projection optical system PL.

Furthermore, with this embodiment there is provided a multi-point focus position detection system being one of the focus detection systems of the inclined incident light type, for detecting the position in the Z direction (optical axis AX direction) of an area of an inner portion and adjacent area of the exposure area IA of the wafer W surface. This multi-point focus position detection system, as shown in FIG. 1, is made up; of an irradiation optical system 40 comprising an optical fiber bundle 80, a mirror 81, a condensing lens 82, a pattern forming plate 83, a lens 84, a mirror 85, and an irradiation objective lens 86, and a reception optical system 42 comprising a condensing objective lens 87, a rotation direction oscillating plate 88, an image formation lens 89, and a receiver 90 having a light reception slit plate 98 and a large number of photosensors.

Here, the respective components constituting the multi-point focus position detection system (40, 42) will be explained together with their operation. Illumination light of a wavelength different from the exposure light, which does not expose the photoresist on the wafer W, is guided from an illumination light source (not shown in FIG. 1) via the optical fiber bundle 80. The illumination light output from the optical fiber bundle 80 illuminates the pattern forming plate 83 by way of the mirror 81, and the condensing lens 82.

On the pattern forming plate 83 is formed a plurality of slit shaped aperture patterns (not shown in FIG. 1) in a matrix arrangement. The illumination light (image beam of the aperture pattern) passed by the respective slit shaped aperture patterns, is projected onto the surface of the wafer W by way of the lens 84, the mirror 85 and the irradiation objective lens 86, so that an image of the slit shaped aperture patterns on the pattern forming plate 83 is projectingly formed on the surface of the wafer W.

Then, a reflected light bundle from the surface to be exposed of the wafer W proceeds in a direction inclined at a predetermined angle to the optical axis AX and symmetrical with the image light bundle from the irradiation optical system 40, and is re-image formed on the light reception slit plate 98 positioned prior to the receiver 90 by way of the condensing objective lens 87, the rotation direction oscillating plate 88, and the image formation lens 89. This re-image formed image is detected by the receiver 90 and is then synchronous detected by a signal of a rotation oscillation frequency by a signal processing unit 91 via a sensor selection circuit 93. After this the plurality of focus signals obtained by synchronous detection by the signal processing unit 91 are supplied to the main control unit 20.

Figure 2:
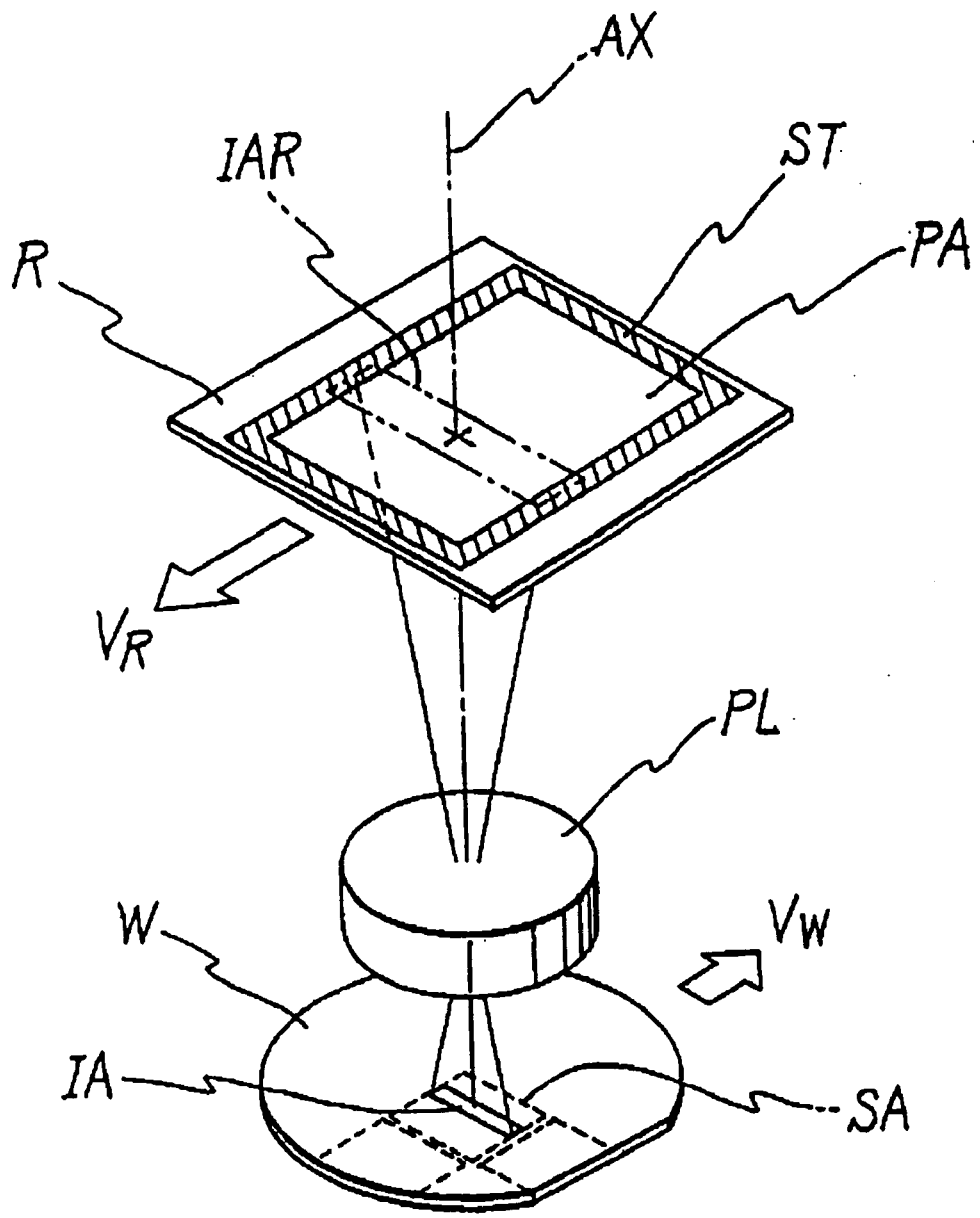
FIG. 2 is a diagram for explaining the theory of scanning exposure of the apparatus of FIG. 1.

With the scanning type exposure apparatus 100 of this embodiment, then as shown in FIG. 2, an illumination area IAR of a rectangular shape (slit shape) having a longitudinal direction in a direction perpendicular to the scanning direction (Y-axis direction) of the reticle R is formed, and the reticle R is scanned in the −Y direction at a speed $V_R$ in regard to the illumination area IAR. The illumination area IAR (with the center approximately coinciding with the optical axis AX) is projected onto the wafer W via the projection optical system PL, so that a slit shape projection area conjugate with the illumination area IAR, that is to say an exposure area IA is formed. Since the wafer W has an inverted image forming relation with the reticle R, the wafer W is synchronized with the reticle R with the direction of the speed $V_R$ in the opposite direction (+Y direction) and is scanned at a speed Vw, so that the whole surface of a shot area SA on the wafer W can be exposed. The scanning speed ratio $V_W/V_R$ is made accurately proportional to the reduction magnification of the projection optical system PL, so that the pattern of a pattern area PA of the reticle R is accurately reduction transferred onto the shot area SA on the wafer W. The width in the longitudinal direction of the illumination area IAR is set so as to be wider than the pattern area PA on the reticle R and narrower than the maximum width of a light stop area ST, so that the whole surface of the pattern area PA can be illuminated by scanning.

With the scanning type exposure apparatus 100, at the time of the abovementioned scanning exposure, alignment of the reticle R and the wafer W is performed by the main control unit 20 via the stage control system 19 and the wafer drive unit 21 etc., based on a detection signal from the alignment detection system (not shown in FIG. 1). Furthermore, based on a detection signal from the multi-point focus position detection system (40, 42), the substrate table 18 is drive controlled in the Z-axis direction and the incline direction by means of the main control unit 20 via the stage control system 19 and the wafer drive unit 21 so that the pattern surface of the reticle R and the surface to be exposed of the wafer W are conjugate with respect to the projection optical system PL, and so that the image formation surface of the projection optical system PL and the surface to be exposed of wafer W coincide (the wafer surface to be exposed falls within the range of the focal depth of the optimum image formation surface of the projection optical system PL), thereby performing adjustment of the surface position (setting of the alignment surface).

The exposure apparatus of the present embodiment is manufactured by assembling the above illumination system and projection optical system in the exposure apparatus body, adjusting the optical parameters thereof, attaching the reticle, the wafer stage, etc., in the exposure apparatus body, and performing the electrical and mechanical connections thereof.

As follows is a description of the scanning exposure method of the embodiment using the abovementioned scanning type exposure apparatus 100.

At first, collection of the first reference information 52 related to target information for alignment of the surface to be exposed of the wafer in the Z direction (optical axis AX direction) at the time of scanning exposure while moving the substrate table 18 along the +Y direction, and of the second reference information 54 related to target information for alignment of the surface to be exposed of the wafer in the Z direction at the time of scanning exposure while moving the substrate table 18 along the −Y direction, is performed.

Figure 3A:
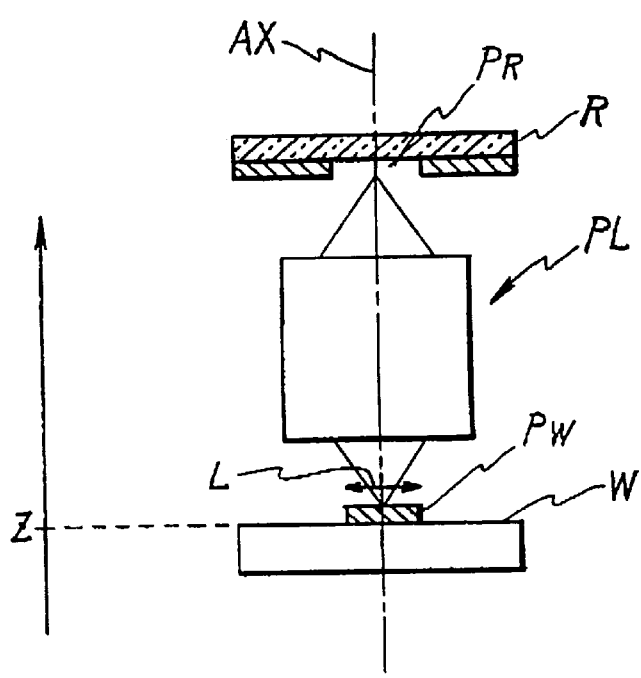
FIGS. 3A–3C are diagrams for explaining the theory of measuring first reference information and second reference information in a scanning exposure method of the first embodiment.
Figure 3B:
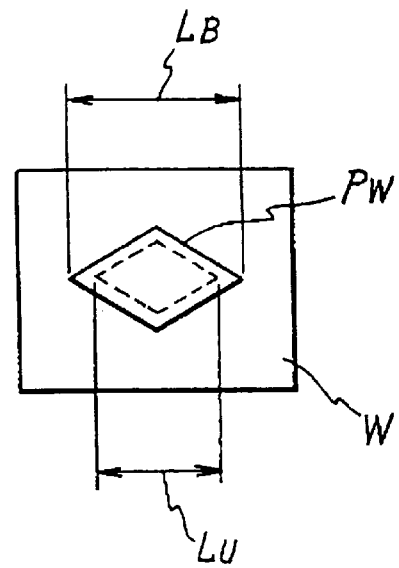
Figure 3C:
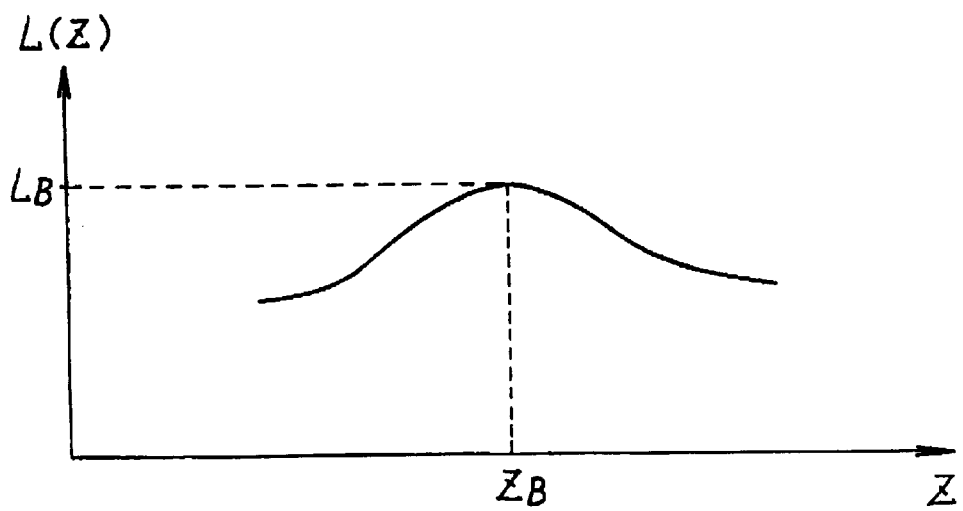

Before describing the collection of the reference information, an outline of the theory of the method for obtaining the reference information will be described. FIG. 3 illustrates the theory of the method for obtaining the reference information of this embodiment. That is to say, FIG. 3(*a*) shows the general positional relationship of the reticle R, a pattern PR (rhombic pattern) formed on the reticle R, the projection optical system PL, the wafer W, and a pattern PW transferred onto the wafer W, FIG. 3(*b*) shows an aspect of the pattern PW transferred onto the wafer W, and FIG. 3(*c*) shows the behaviour of the change in a size L(Z) of the pattern $P_W$ defined by the length of the diagonal line in the lengthwise direction of the rhombic pattern, depending on the position in the Z direction of the area to be exposed of the wafer W.

With the positional relationship shown in FIG. 3(*a*), in the case where the rhombic pattern PR formed on the reticle R is transferred onto the wafer W via the projection optical system PL, the size L(Z) of the pattern PW transferred onto the wafer W differs depending on the position of the area to be exposed of the wafer W with respect to the Z direction. That is to say, when a best focus surface ($Z=Z_B$) determined by the position of the reticle R with respect to the Z direction and the image formation characteristics of the projection optical system PL, and the area (surface) to be exposed of the wafer W coincide, the size $L(Z_B)$ of the pattern Pw becomes the peak value ($=L_B$) for the change in the vicinity of the best focus surface of the area to be exposed of the wafer W which depends on the position in the Z direction. That is to say, the size $L_B$ of the pattern PW when the best focus surface and the area to be exposed of the wafer W coincide, always becomes much larger or always becomes much smaller than the size $L_U$ of the pattern $P_W$ when the best focus surface and the area to be exposed of the wafer W do not coincide. Whether this becomes larger or becomes smaller depends on whether the transfer method is a positive transfer or a negative transfer. Furthermore, this differs depending on the exposure dose value and the threshold value of the exposure dose value for effective transfer. Here in FIG. 3, the case is shown for where the best focus surface and the area to be exposed of the wafer W coincide and the transferred pattern PW becomes larger than when the best focus surface and the area to be exposed of the wafer do not coincide. That is to say the case where $L_B > L_U$ is shown (refer to FIG. 3(*b*). Hereunder description is based on this case.

Accordingly, by carrying out the following steps, an alignment target position (target surface) related to the Z direction of the wafer W where the area (surface) to be exposed of the wafer W becomes the best focus surface can be obtained, and the first reference information 52 and the second reference information 54 then collected.

To explain briefly, scanning exposure is performed by simultaneously moving the reticle R and the wafer W under the same mode as at the time of device manufacture, while changing the position of the wafer W with respect to the Z direction, and the size L (Z) of the respective patterns transferred to the wafer W is measured at a plurality of positions with respect to the Z direction. After this, the change in the size L(Z) of the measured pattern depending on the change in the position of the wafer W with respect to the Z direction is studied, and the target position $Z_B$ where the size L(Z) of the measured pattern becomes the maximum value $L_B$ is obtained (refer to FIG. 3(*c*)). As a result, the best target position $Z_B$ related to the alignment of the wafer W in the Z direction in a moving mode of the reticle R and a moving mode of the wafer W which are the same as at the time of device manufacture is reliably obtained, thereby enabling the reference information serving as information related to the best target position $Z_B$ to be obtained.

Figure 4:
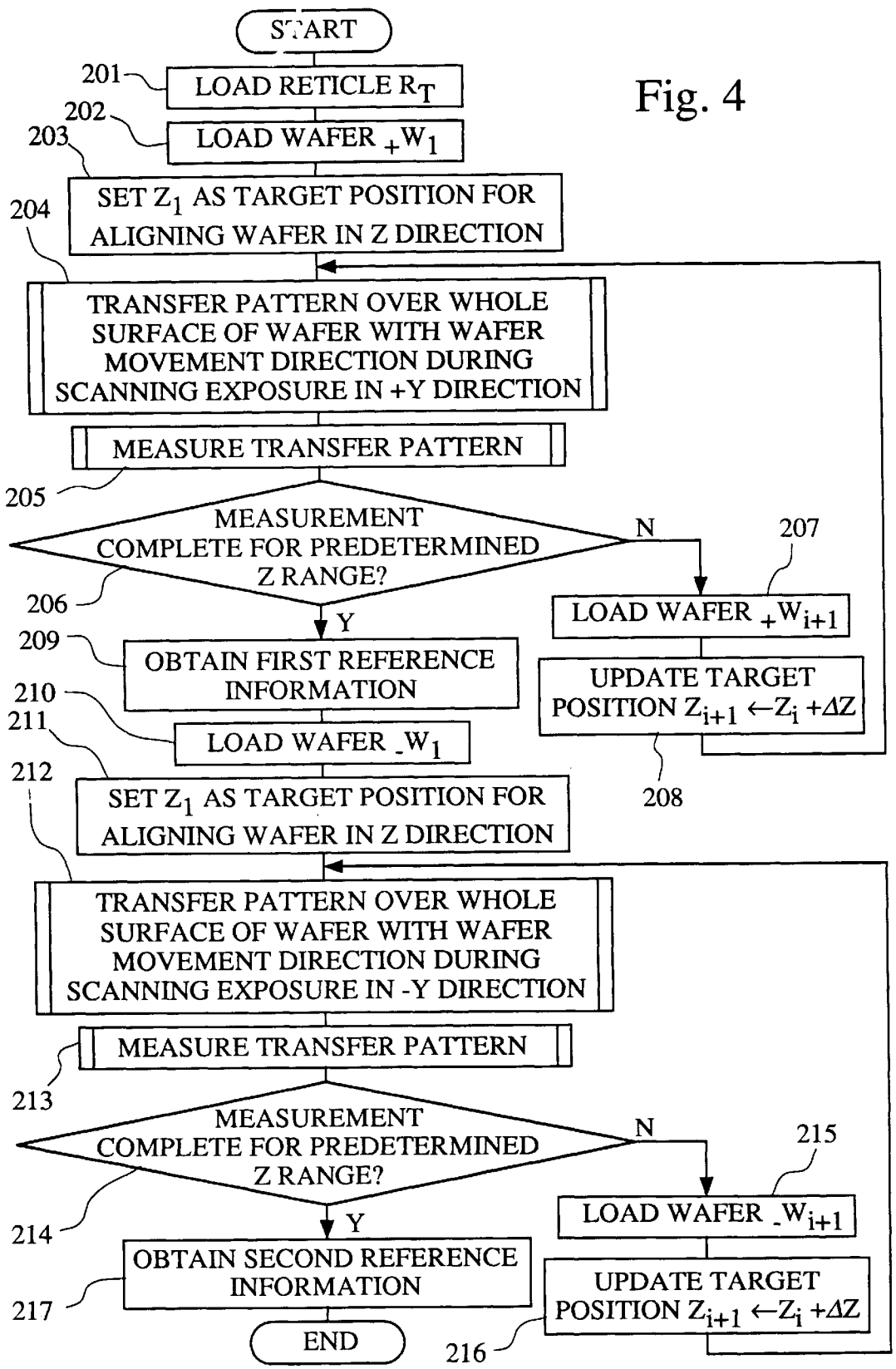
FIG. 4 is a flow chart for a collection process for the first reference information and the second reference information in the scanning exposure method of the first embodiment.
Figure 5:
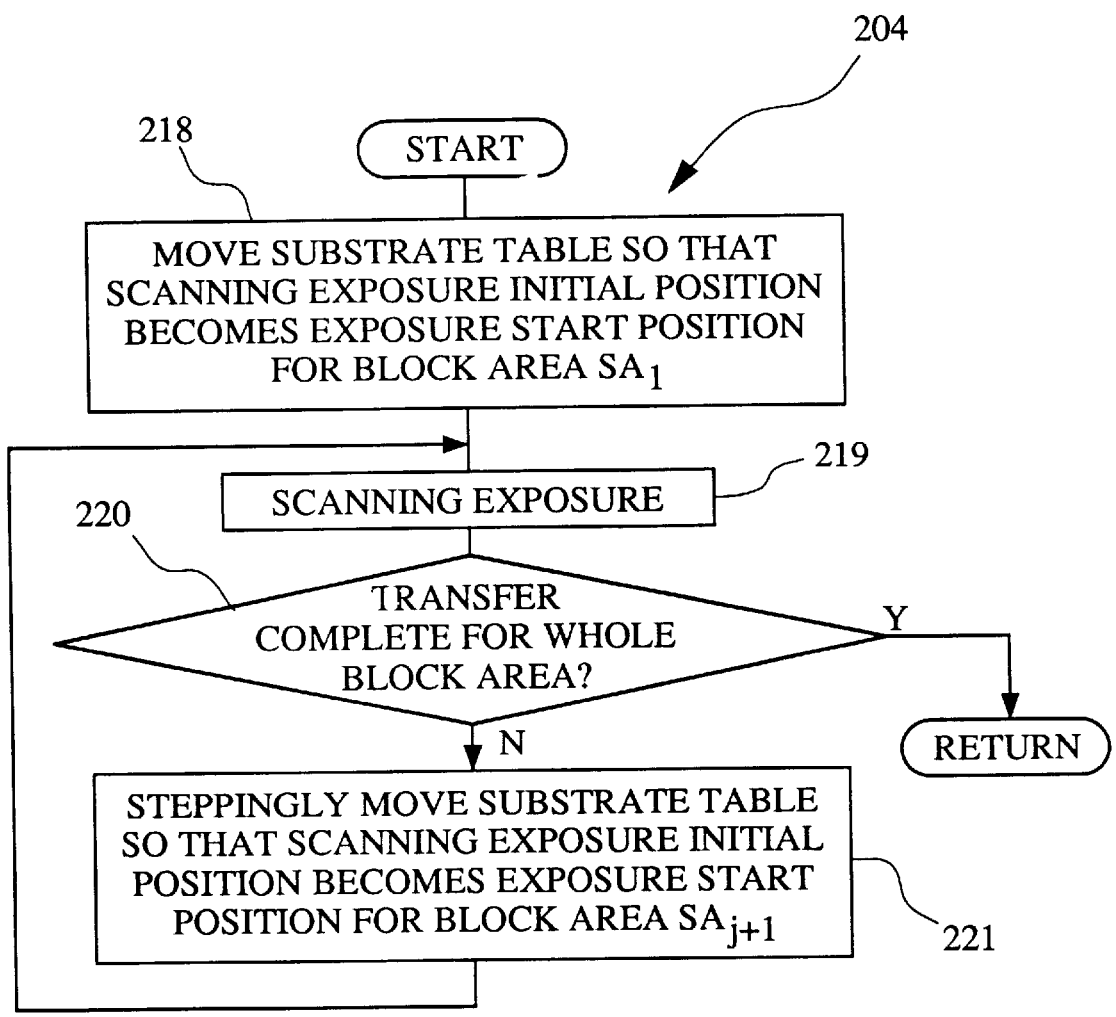
FIG. 5 is a flow chart for the process of a subroutine 204 in FIG. 4.
Figure 6:
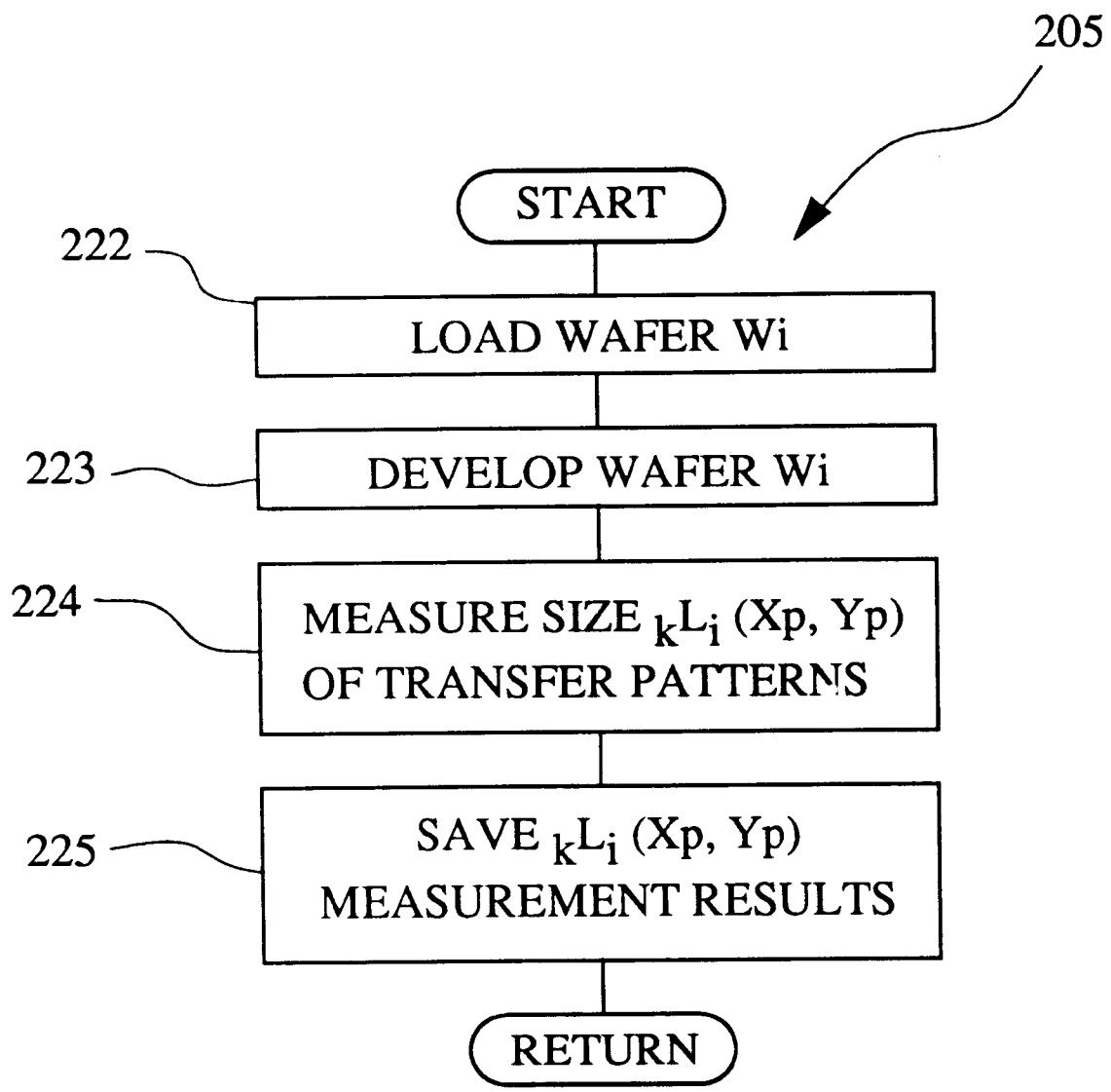
FIG. 6 is a flow chart for the process of a subroutine 205 in FIG. 4.

Hereunder, referring to FIG. 4 through FIG. 8, is a detailed description of the collection method for the first reference information 52 and the second reference information 54 in this embodiment. FIG. 4 though FIG. 6 show a flow chart for the collection of the first reference information 52 and the second reference information 54 of the embodiment.

Figure 7:
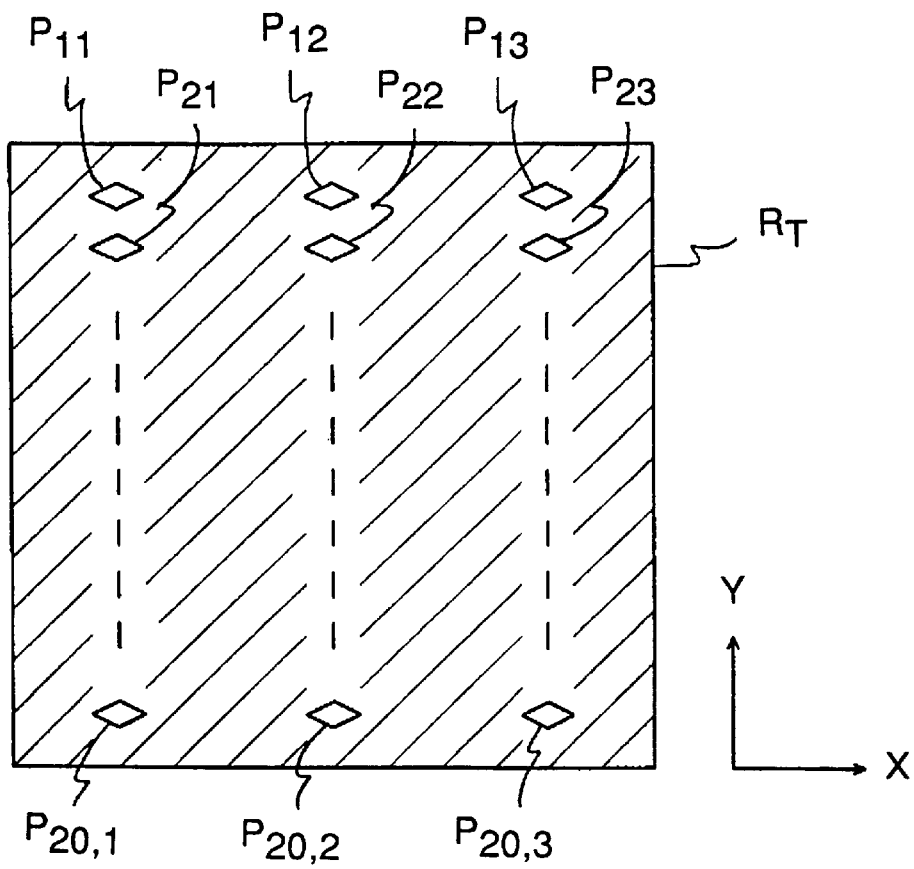
FIG. 7 is a diagram for explaining a pattern of a measurement reticle $R_T$.

At first, in step 201 of FIG. 4, a reference information collection reticle $R_T$ is loaded onto a reticle stage RST by means of a reticle loader (not shown in the figures). FIG. 7 shows a pattern structure formed in the reference information collection reticle $R_T$ used in this embodiment. On the reticle $R_T$ as shown in FIG. 7 is arranged, at a desired X-Y position resolution, rhombic patterns $P_{mn}$(m=1~20, n=1~3) in a matrix shape of for example 20 lines and 3 columns with the length of the diagonal line several microns. The row direction is the X-axis direction being the direction perpendicular to the scanning direction, while the column direction is the Y-axis direction being the canning direction. The reason for making the number (=20) of rhombic shaped patterns along the column direction larger than the number (=3) of rhombic shaped patterns along the row direction, is because during scanning exposure the reticle and the wafer are simultaneously moved along the Y-axis direction, but are only moved slightly in the X-axis direction.

To continue, returning to FIG. 4, in step 202, a wafer $+W_1$ for reference information collection is loaded onto the substrate table 18 by means of a wafer loader (not shown in the figures). Here with the collection of the reference information in this embodiment, measurement wafers are interchanged for each wafer movement direction k (k=+Y direction, or −Y direction) and for each target position $Z_i$(i=1~n; $Z_{i+1}-Z_i=\Delta Z$) related to the alignment of the wafer in the Z direction. These respective wafers are represented by wafer $_kW_i$ (where k=+ or k=−). Here for the respective wafers $_kW_i$, wafers which are completely different may be used, and the same substrates can also be used by repainting with photosensitive material.

Next in step 203, the main control unit 20 notifies the stage control system 19 that the target position in the scanning exposure related to the alignment of the wafer $_+W_1$ in the Z direction is $Z_1$. That is to say notifies the stage control system 19 that the focus offset should be controlled to a predetermined value (=$F_0$). To continue, in step 204, with the movement direction of the wafer $_+W_1$ during scanning exposure as the +Y direction, the pattern formed in the reticle $R_T$ is transferred to the whole surface of the surface to be exposed of the wafer $_+W_1$.

FIG. 5 shows a flow chart for the subroutine 204. With the subroutine 204, at first in step 218, the substrate table 18 is moved to the scanning exposure initial position of an area $SA_1$ inside a block area $SA_j$(j=1~m) of the surface to be exposed of the wafer $_+W_1$. This movement is performed by the main control unit 20 via the stage control system 19 and the wafer drive unit 21 etc. Here the respective block areas $SA_j$ coincide with the respective shot areas at the time of device manufacture.

Then, in step 219, the reticle $R_T$ and the wafer $_+W_1$ are synchronously moved as described beforehand with reference to FIG. 2, to execute scanning exposure for the block area $SA_1$ of the surface to be exposed of the wafer $_+W_1$. With this scanning exposure, based on a detection signal from the multi-point focus position detection system (40, 42), the substrate table 18 is drive controlled in the Z-axis direction by means of the main control unit 20 via the stage control system 19 and the wafer drive unit 21 so that the alignment target position in the Z-axis direction becomes $Z_1$, and together with this is drive controlled in the incline direction, thereby performing adjustment of the surface position (setting of the alignment surface).

On completion of step 219, then in step 220 it is judged if scanning exposure has been completed for all of the block areas. Since up to here only the block area $SA_1$ has been subjected to scanning exposure, it is judged that scanning exposure has not been completed for all of the block areas. Therefore, in step 221, the substrate table 18 is moved by means of the main control unit 20 via the stage control system 19 and the wafer drive unit 21 etc., to the scanning exposure start position for the block area $SA_2$ which is to be scanning exposed next. At this time, the reticle $R_T$ is returned to the scanning exposure start position. To continue, in step 219, scanning exposure is performed in relation to the block area $SA_2$ in the same way as for the case of the block area $SA_1$.

Subsequently, until judged in step 220 that scanning exposure has been completed for all of the block areas, scanning exposure is successively executed in relation to the block areas $SA_j$(j=3~m). In this way, the pattern formed on the reticle $R_T$ is transferred to all surfaces of the surface to be exposed of the wafer $_+W_1$, for the case where in the scanning exposure the target position related to the alignment of the wafer in the Z direction is $Z_1$. That is to say, the rhombic patterns are transferred to the respective positions $(X_p, Y_p)$ of the surface to be exposed of the wafer $_+W_1$. In step 220, when judged that scanning exposure has been completed for all of the block areas, control returns to the main routine.

Next, returning to FIG. 4, in subroutine 205, the sizes of the rhombic patterns transferred to the respective positions $(X_p, Y_p)$ of the wafer $_+W_1$, that is to say the lengths $_+L_1(X_p, Y_p)$ of the diagonal lines in a predetermined direction of the respective rhombic patterns are measured. FIG. 6 shows a flow chart for the subroutine 205.

With the subroutine 205, at first in step 222, the wafer $_+W_1$ is unloaded from the substrate table 18. To continue, in step 223 the wafer $_+W_1$ is developed. Then, in step 224, the developed wafer $_+W_1$ is inspected, and the lengths $_+L_1(X_p, Y_p)$ of the diagonal lines in the predetermined direction of the respective rhombic patterns are measured. Here, the lengths of the diagonal lines in the predetermined direction of the respective rhombic patterns are represented by $_kL_1(X_p, Y_p)$ (i=1~n: corresponding to target position $Z_i$ for alignment of the wafer in the Z-axis direction, k=+ or −: corresponding to the scanning direction). Hereunder the same notation is used. For this measurement, the previously described alignment detection system of the off axis form provided in the scanning type exposure apparatus 100 of the embodiment may be used, or this may be performed with a different apparatus such as a scanning electron microscope. Then in step 225, the measurement results $_+L_1(X_p, Y_p)$ are stored, and control returns to the main routine.

Next, returning to FIG. 4, in step 206 it is judged if measurement has been completed for the target position related to the alignment of the wafer in the Z direction over a predetermined range. Since up to here, measurement has only been completed for the target position $Z_1$, it is judged that measurement has not been completed for the target position related to the alignment of the wafer in the Z direction over the predetermined range. Then in step 207, a wafer $_+W_2$ for reference information collection is loaded onto the substrate table 18 by means of the wafer loader (not shown in the figure). After this, in step 208, the main control unit 20 notifies the stage control system 19 that the target position in the scanning exposure related to the alignment of the wafer $_+W_2$ in the Z direction is $Z_2(=Z_1+\Delta Z)$. That is to say notifies the stage control system 19 that the focus offset should be controlled to a predetermined value (=$F_0+\Delta Z$).

To continue, in step 204, with the movement direction of the wafer $_+W_2$ during scanning exposure as the +Y direction, the pattern formed in the reticle $R_T$ is transferred to the whole surface of the surface to be exposed of the wafer $_+W_2$. In subroutine 205, the size of the rhombic pattern transferred to the respective positions $(X_p, Y_p)$ of the wafer $_+W_2$, that is to say the lengths $_+L_2(X_p, Y_p)$ of the diagonal lines in a predetermined direction of the respective rhombic patterns are measured and saved.

After this, in step 206, measurement of the transfer patterns related to the target positions $Z_i$(i=3~n) is successively executed until judged that measurement has been completed for the target positions related to the alignment of the wafer in the Z direction over the predetermined range.

In step 206, when judged that scanning exposure has been completed for all of the block areas, then in step 209, the first reference information 52 is collected. In step 209, the best target positions $_+Z_B(X_p, Y_p)$ at the respective positions $(X_p, Y_p)$ for the case where the movement direction of the wafer during scanning exposure is the +Y direction, are obtained as follows. Here, the best target positions at the respective positions $(X_p, Y_p)$ are represented by $_kZ_B(X_p, Y_p)$ (k=+ or −: corresponding to the scanning direction). Hereunder the same notation is used.

Figure 8:
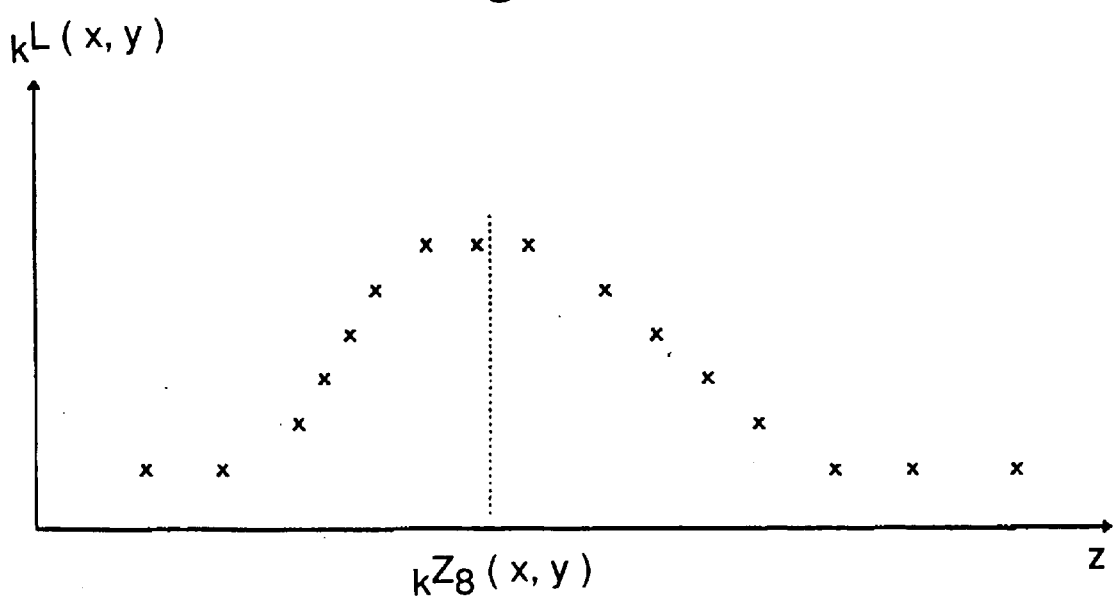
FIG. 8 is a graph showing a relationship between a Z position of a wafer W and a size $_kL(X, Y)$ of a transfer pattern.

At first, a length $_+L_1(X_1, Y_1)$ for one position $(X_1, Y_1)$ is selected from amongst the saved lengths $_+L_1(X_p, Y_p)$, and the change in the length $_+L_1(X_1, Y_1)$ due to changing the target position Z is examined. FIG. 8 shows the behaviour of the change in the length $_+L_1(X_1, Y_1)$ due to the change in the target position Z. Then, by obtaining the Z value where for example the length $_+L_1(X_1, Y_1)$ becomes a maximum, this Z value is obtained as the best target position $_+Z_B(X_1, Y_1)$ at the position $(X_1, Y_1)$ inside the wafer. After this, the best target positions $_+Z_B(X_p, Y_p)$ are obtained for all of the remaining positions $(X_p, Y_p)$ (p=2, 3, . . . ) in the same way as for the case of the position $(X_1, Y_1)$. There are various methods other than this for obtaining the best target positions $_+Z_B(X_p, Y_p)$. For example, it has been considered to make the various $_+L(X_p, Y_p)$ values threshold values and obtain the center points of the Z values for these threshold values, and then compute the mean value of the obtained center points to obtain the best target positions $_+Z_B(X_p, Y_p)$. In this way, the information corresponding to the obtained best target positions $_+Z_B(X_p, Y_p)$ (p=1, 2, . . . ) is obtained as the first reference information 52 related to the position of the target surface for alignment of the surface to be exposed of the wafer in the optical axis AX direction of the projection optical system PL when the wafer is scanning exposed while moving the substrate table 18 along the +Y direction. As to the contents of the processing from the best target positions $_+Z_B(X_p, Y_p)$ (p=1, 2, . . . ) to the first reference information 52, for example a process is considered for obtaining this for each respective Y coordinate value, from the best target positions respectively corresponding to the three rhombic patterns $P_{m1} \sim P_{m3}$ of the same X coordinate value formed on the reticle $R_T$, as positions of the target surface for alignment with respect to the Z direction in that X coordinate. The first reference information 52 obtained in this way, is stored in the storage device 50 corresponded with the movement position of, for example, the reticle R or the wafer W at the time of performing scanning exposure.

In this way, when the measurement for the first reference information 52 for the case where the movement direction of the wafer during the scanning exposure is the +Y direction is completed, an operation the same as for the case of the +Y direction is performed using the wafer $_-W_i$(i=1~n), with the movement direction of the wafer during scanning exposure in the −Y direction (steps 210~217 in FIG. 4), to obtain the best target positions $_-Z_B(X_p, Y_p)$. The information corresponding to the best target positions $_-Z_B(X_p, Y_p)$ obtained in this way is stored in the storage device 50 as second reference information 54 related to the target position for alignment of the surface to be exposed of the wafer in the optical axis AX direction of the projection optical system PL at the time of scanning exposure of the wafer while moving the substrate table 18 along the −Y direction.

With the above, the collection of the first reference information 52 and the second reference information 54 for the movement mode of the reticle R and the movement mode of the wafer W the same as at the time of device manufacture, is completed.

Next is a description of the exposure operation by the scanning type exposure apparatus 100 of the present embodiment, for the case of device manufacture.

At first, a reticle R formed with a pattern to be transferred is loaded onto the reticle stage RST by means of the reticle loader. Similarly, a wafer to be exposed is loaded onto the substrate table 18 by means of the wafer loader.

Then, by means of the main control unit 20, preparation operations for reticle alignment and base line measurement etc. are performed in a predetermined sequence using a reticle microscope (not shown in the figure), the reference mark plate FM on the substrate table 18, and the alignment detection system (not shown in the figures). After this, alignment measurement for EGA (enhanced global alignment) or the like using the alignment detection system is executed. On completion of this alignment measurement, an exposure operation of the step-and-scan method is performed.

With this exposure operation, at first the substrate table 18 is moved so that the XY position of the wafer W becomes the scanning start position for exposure of the initial shot area on the wafer W. This movement is performed by means of the main control unit 20 via the stage control system 19 and the wafer drive unit 21 etc. At the same time, the reticle stage RST is moved so that XY position of the reticle R becomes the scanning start position. This movement is performed by means of the main control unit 20 via the stage control system 19 and a reticle drive section (not shown in the figure) etc. Then, the stage control system 19 simultaneously moves the reticle R and the wafer W via the reticle drive section (not shown in the figure) and the wafer drive unit 21 based on the XY position information of the reticle R measured by the reticle interferometer 16, and the XY position information of the wafer W measured by the wafer interferometer 31. Together with this simultaneous movement, the scanning exposure is performed.

In this way, the wafer W and the reticle R are moved to their respective scanning start positions and before simultaneous movement, the main control unit 20 judges the direction for moving the wafer W in the subsequently performed scanning exposure. With this judgement, a previously set exposure map may be referred to. Furthermore, this may be judged from the scanning start position of the reticle R. Here in the following explanation, the direction in which the wafer W moves in relation to the initial shot area is given as the +Y direction.

When the main control unit 20 judges that the movement direction of the wafer W is the +Y direction (the movement direction of the reticle R is the −Y direction), then in the subsequently performed scanning exposure, the first reference information 52 related to the target surface with which the surface to be exposed of the wafer W is to be aligned is referred to. Then, during scanning exposure, the main control unit 20 drive controls the substrate table 18 in the Z-axis direction and the incline direction via the stage control system 19 and the wafer drive unit 21 based on the first reference information 52 and the Z position information for the wafer detected by the multi-point focus position detection system (40, 42), to thereby perform surface position adjustment.

With this surface position adjustment, the respective Z position information detected at the plurality of measurement points of the multi-point focus position detection system (40, 42) is made the deviation between the position of the wafer W surface with respect to the optical axis AX direction, and the target position (target surface). Then based on the first reference information 52 stored in the storage device 50, the main control unit 20 modifies the target position used by the multi-point focus position detection system (40, 42), and the stage control system 19 drives the substrate table 18 via the wafer drive unit 21 to align the surface to be exposed of the wafer W with the target surface.

It is also possible for the stage control system 19 to correct the Z position information detected by the multi-point focus position detection system (40, 42), based on the first reference information 52 stored in the storage device 50, and then based on this corrected position information, to drive the substrate table 18 via the wafer drive unit 21 to align the surface to be exposed of the wafer W with the target surface.

In either case, the surface to be exposed of the wafer W can be aligned with the target surface with which the surface to be exposed of the wafer W is to be aligned in accordance with the movement mode of the wafer W.

On completion of the transfer of the reticle pattern to one shot area by the scanning exposure performed while controlling in the above manner, the substrate table 18 is stepped in the non scanning direction (X-axis direction) by an amount for one shot area, and scanning exposure is performed for the next shot area in a scanning direction (Y direction) opposite to the case of the scanning exposure for the previous shot area. With this scanning exposure, the second reference information 54 related to the target surface with which the surface to be exposed of the wafer W is to be aligned is referred to, and the target position used by the multi-point focus position detection system (40, 42) is modified. Subsequently, with the scanning exposure where the wafer W is moved in the +Y direction (the reticle R is moved in the −Y direction), the first reference information 52 is referred to for control, while with the scanning exposure where the wafer W is moved in the −Y direction (the reticle R is moved in +Y direction), the second reference information 54 is referred to for control.

In this way, the stepping and scanning exposure is successively repeated so that a pattern of the required shot number is transferred onto the wafer W with good exposure accuracy.

With this embodiment, for the reticle $R_T$ which is used in the collection of the first reference information and the second reference information, one wherein rhombic patterns are arranged at a pitch corresponding to the desired position resolution is used. However provided the rhombic pattern portion is of a type which can pass light, then one rhombic pattern is sufficient. Furthermore, the rhombic patterns may be arranged at a pitch of a predetermined number of times the pitch corresponding to the desired positional resolution. In these cases, with the pattern transfer related to the respective block areas, the scanning exposure is performed the necessary number of times in the X direction or the Y direction by stepping the wafer by the desired resolution amount. Here, if the rhombic pattern portion is a light shut off type, a reticle wherein rhombic patterns are formed at a pitch corresponding to the desired position resolution over the whole of the pattern area of the reticle is necessary.

Furthermore, it is possible to use reticles arranged at a pitch of a predetermined number of times the pitch corresponding to the desired positional resolution, and after obtaining the best target positions $_kZ_B(X_p, Y_p)$ in the same way as with this embodiment, at a courser positional accuracy than the desired positional resolution, perform interpolation such as linear interpolation to obtain the first reference information and the second reference information at the desired positional resolution.

Moreover, with the present embodiment, the position of the target surface for alignment of the surface to be exposed of the wafer W is adjusted. However prior to commencement of the scanning exposure, the main control unit 20 can modify the image formation surface by means of the projection optical system PL in accordance with the movement direction of the wafer W via the image formation characteristic correction controller 68, based on the first reference information 52 and the second reference information 54 which are to be referred to in the subsequently performed scanning exposure. Furthermore, it is also possible to modify the image formation surface of the pattern image of the reticle R by moving the reticle R in the optical axis AX direction and inclining with respect to the optical axis AX.

In addition, it is also possible to perform this by combining the modification of the target surface for the surface to be exposed of the wafer W and the modification of the image formation surface by means of the projection optical system PL.

Furthermore, one of the reference information can be stored as a deviation of the other reference information. For example, the second reference information which is referred to when the wafer W is moved in the −Y direction may be stored as information related to the deviation between the target surface for alignment of the surface to be exposed of the wafer W when the wafer W is moved in the +Y direction, and the target surface for alignment of the surface to be exposed of the wafer W when the wafer W is moved in the −Y direction.

Second Embodiment

As follows is a description of a scanning type exposure apparatus and a scanning exposure method according to a second embodiment of the present invention, with reference to FIG. 9 through FIG. 12. This embodiment, compared to the first embodiment, has the characteristic in the point that in the collection of the first reference information and the second reference information, one measurement wafer is used for each movement direction of the wafer. In the following description, similar components are denoted by the same symbol and repeated description thereof is omitted.

The scanning type exposure apparatus of this embodiment, as with the first embodiment, is one where the wafer serving as the sensitive substrate is moved in the +Y direction and the −Y direction during scanning exposure, and the reticle R serving as the mask is simultaneously moved with the wafer to perform scanning exposure. This has the same construction as the scanning type exposure apparatus shown in FIG. 1.

As follows is a description of the scanning exposure method of this embodiment, using the abovementioned scanning type exposure apparatus 100.

At first, collection of the first reference information 52 related to target information for alignment of the surface to be exposed of the wafer in the Z direction (optical axis AX direction) at the time of scanning exposure while moving the substrate table 18 along the +Y direction, and of the second reference information 54 related to target information for alignment of the surface to be exposed of the wafer in the Z direction at the time of scanning exposure while moving the substrate table 18 along the −Y direction, is performed. This reference information collection, is performed based on the theory of the method for obtaining the reference information as described for the first embodiment with reference to FIG. 3.

Figure 9:
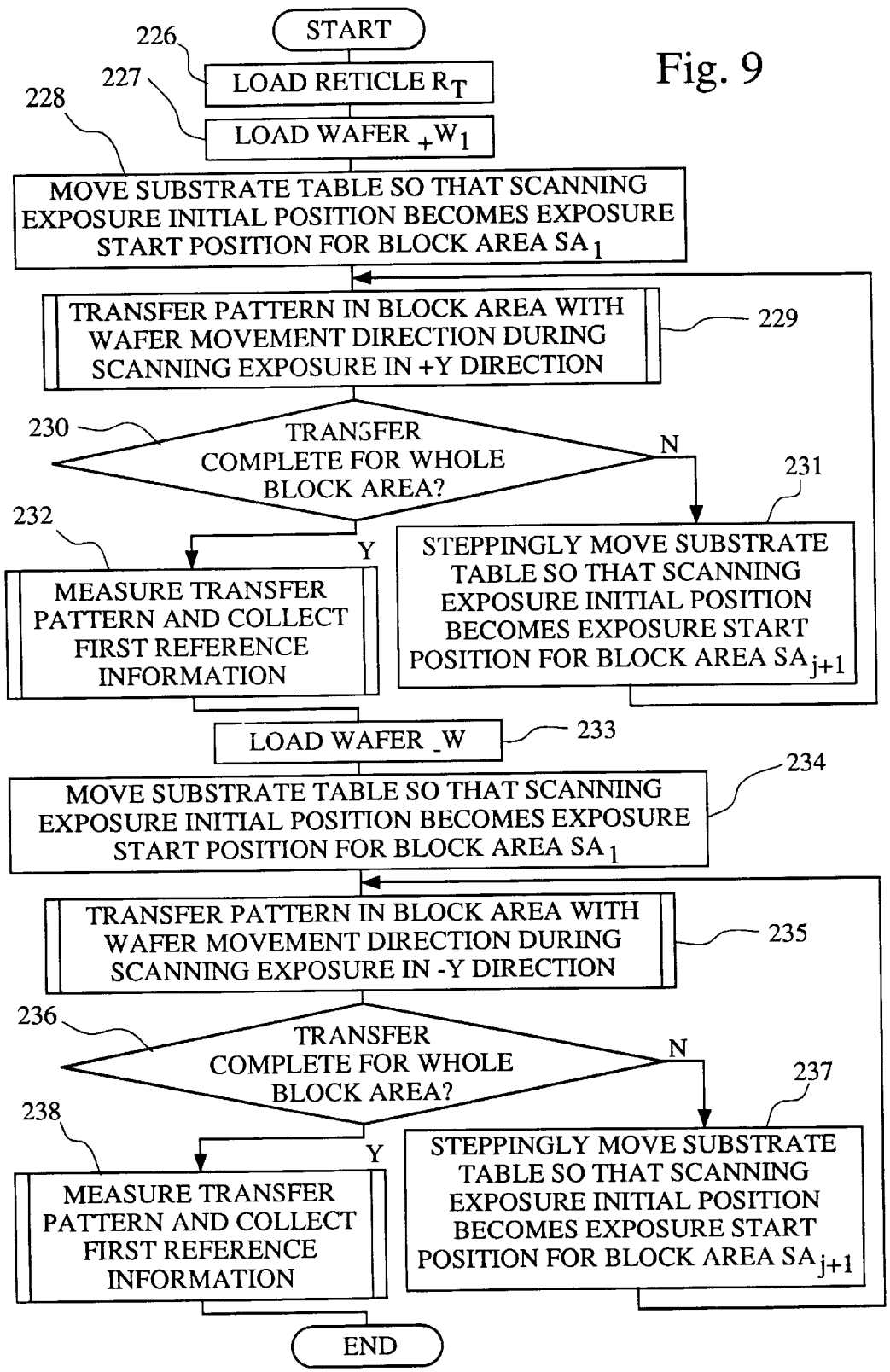
FIG. 9 is a flow chart for a collection process for first reference information and second reference information in a scanning exposure method of a second embodiment.
Figure 10:
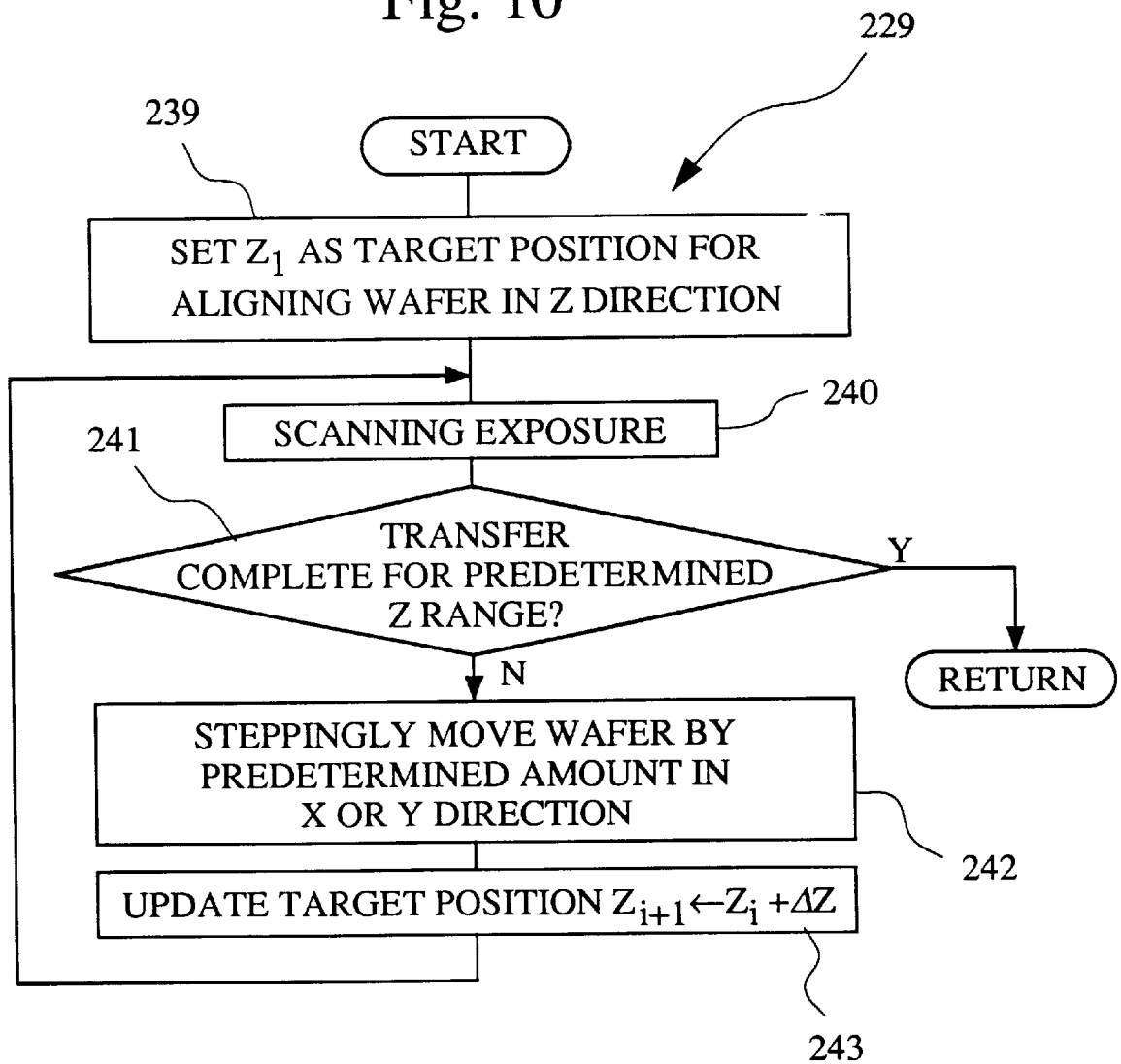
FIG. 10 is a flow chart for the process of a subroutine 229 in FIG. 9.
Figure 11:
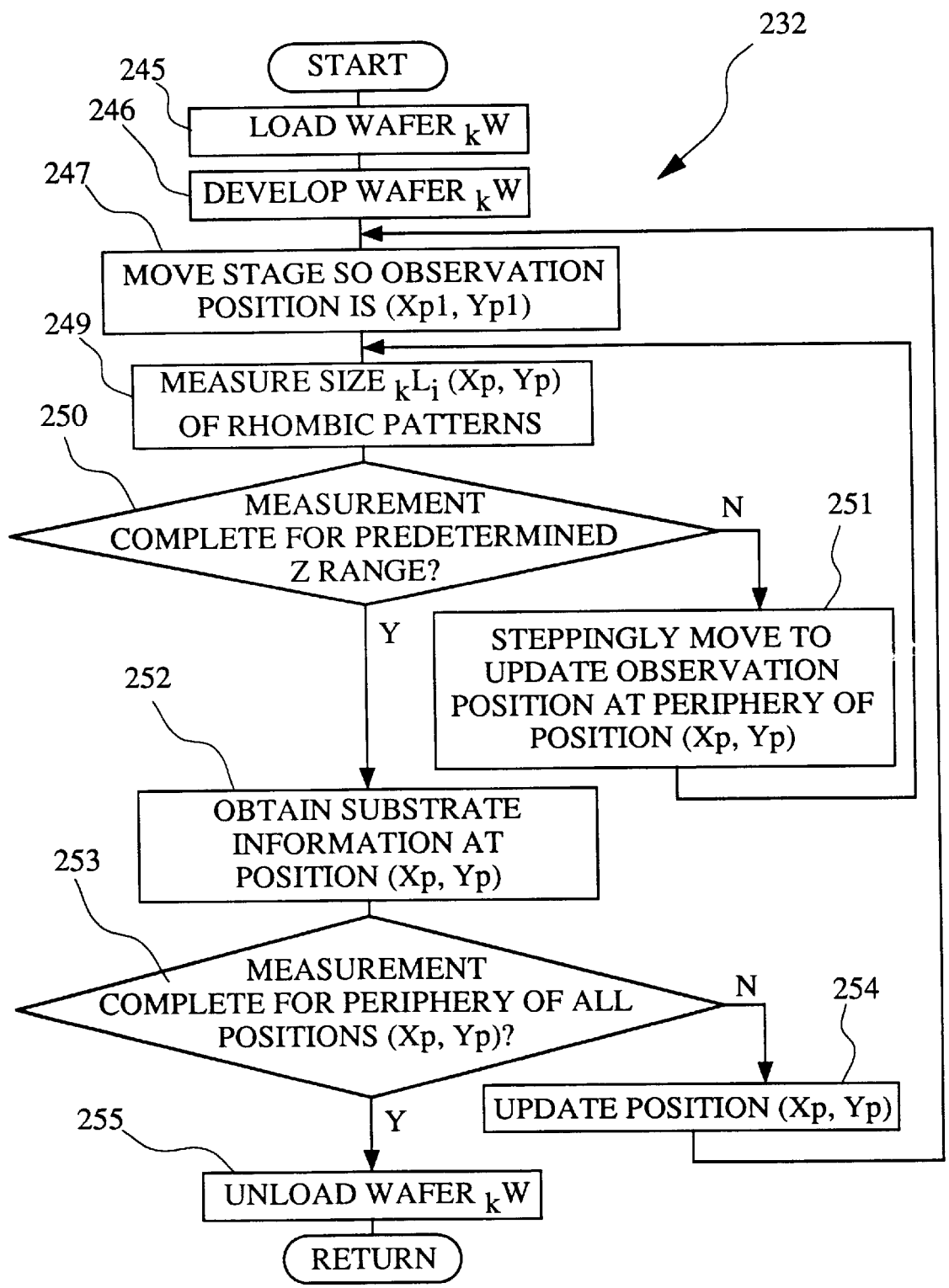
FIG. 11 is a flow chart for the process of a subroutine 232 in FIG. 9.

Hereunder, referring to FIG. 9 through FIG. 12, is a detailed description of the collection method for the first reference information 52 and the second reference information 54 in this embodiment. FIG. 9 though FIG. 11 show a flow chart for the collection of the first reference information 52 and the second reference information 54 with this embodiment.

At first, in step 226 of FIG. 9, a reference information collection reticle $R_T$ is loaded onto a reticle stage RST by means of a reticle loader (not shown in the figures), as with the first embodiment. To continue, in step 227, a wafer $_+W$ for reference information collection is loaded onto the substrate table 18 by means of a wafer loader (not shown in the figures). Here with the collection of the reference information in this embodiment, measurement wafers are interchanged for each wafer movement direction k (k=+Y direction, or −Y direction). These respective wafers are represented by wafer kW (where k=+ or k=−). Here, as with the first embodiment, for the respective wafers $_kW$, wafers which are completely different may be used, and the same substrates can also be used by repainting with photosensitive material.

Then, in step 228, the substrate table 18 is moved to the scanning exposure initial position of an area $SA_1$ inside a block area $SA_j$(j=1~m) of the surface to be exposed of the wafer +W. This movement is performed by the main control unit 20 via the stage control system 19 and the wafer drive unit 21 etc. Here, as with the first embodiment, the respective block areas $SA_j$ coincide with the respective shot areas at the time of device manufacture. To continue, in subroutine 229, with the movement direction of the wafer $_+W$ at the time of scanning exposure as the +Y direction, then while changing the target position related to the alignment of the wafer in the Z direction over a predetermined range, the pattern formed on the reticle $R_T$ is transferred to inside the block area $SA_1$ of the wafer $_+W$ for each respective target position $Z_i(i=1\sim n)$.

FIG. 10 shows a flow chart for the subroutine 229. With the subroutine 229, at first in step 239, the main control unit 20 notifies the stage control system 19 that the target position in the scanning exposure related to the alignment of the wafer $_+W$ in the Z direction is $Z_1$. That is to say notifies the stage control system 19 that the focus offset should be controlled to a predetermined value ($=F_0$). To continue, in step 240, the reticle $R_T$ and the wafer $_+W$ are synchronously moved as described beforehand with reference to FIG. 2, to execute scanning exposure for the block area $SA_1$ of the surface to be exposed of the wafer +W. With this scanning exposure, as with the first embodiment, based on a detection signal from the multi-point focus position detection system 40, 42, the substrate table 18 is drive controlled in the Z-axis direction by means of the main control unit 20 via the stage control system 19 and the wafer drive unit 21 so that the alignment target position in the Z-axis direction becomes $Z_1$, and is drive controlled in the incline direction, thereby performing adjustment of the surface position (setting of the alignment surface).

Figure 12:
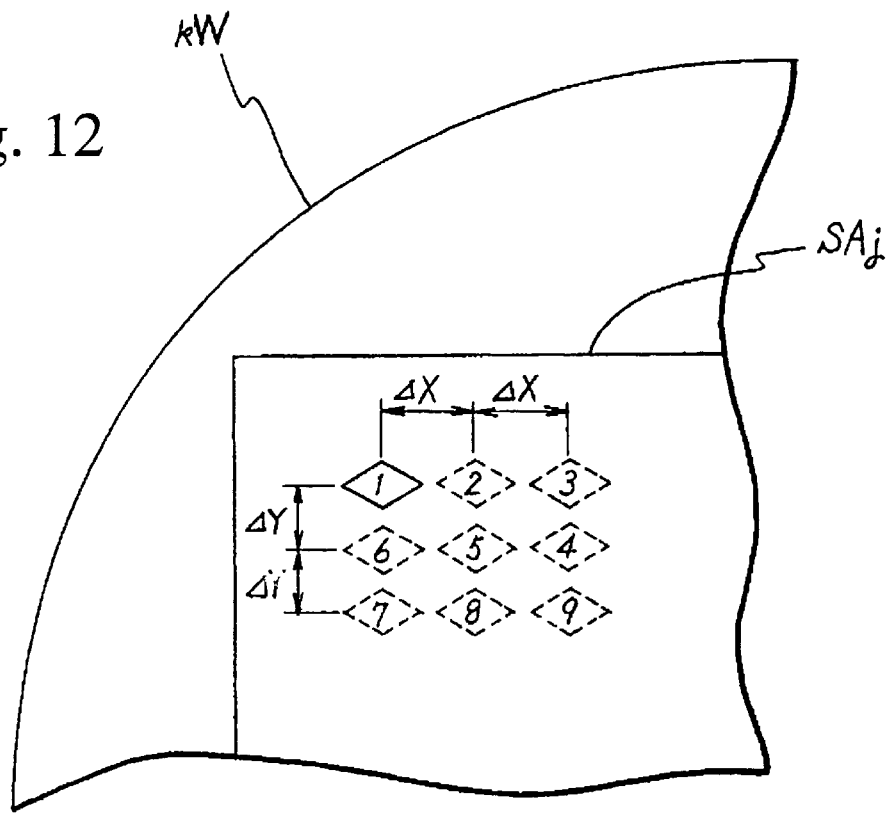
FIG. 12 is a diagram for explaining a transfer pattern at the time of collection of the first reference information and the second reference information in the second embodiment.

Next, in step 241 it is judged if pattern transfer has been completed for the target position related to the alignment of the wafer in the Z direction over the predetermined range. Since up to here, pattern transfer has only been completed for the target position $Z_1$, it is judged that pattern transfer has not been completed for the target position related to the alignment of the wafer in the Z direction over the predetermined range. Therefore in step 242, the wafer $_+W$ is steppingly moved in the X direction or the Y direction (including the X direction and the Y direction) so that a new rhombic pattern is transferred by the subsequent scanning exposure to the peripheral area of the rhombic patterns transferred up until the previous time, such that the rhombic pattern transferred by the subsequent pattern transfer does not overlap the rhombic patterns transferred by the pattern transfers up until the previous time. At this time, the reticle $R_T$ is returned to the scanning exposure start position. The movement of the wafer $_+W$ is performed by the main control unit 20 via the stage control system 19 and the wafer drive unit 21 etc. FIG. 12 shows an example of this fine movement. FIG. 12 shows the case for where the target position related to the alignment of the wafer in the Z direction changes from $Z_1\sim Z_9$. The areas to which the rhombic patterns corresponding to the target positions $Z_i$ are transferred are denoted by i, and extraction lines are omitted. As shown in FIG. 12, the transfer areas for the rhombic patterns corresponding to the respective target positions $Z_i$ are arranged at a pitch of $\Delta X$ in the X direction and at a pitch of $\Delta Y$ in the Y direction. This $\Delta X$ and $\Delta Y$ is set slightly larger than the expected maximum value related to the X direction and Y direction of the rhombic patterns to be transferred. Here the $\Delta X$ and the $\Delta Y$ are sufficiently smaller than the desired positional resolution related to the X direction and the Y direction.

Next, returning to FIG. 10, in step 243, the main control unit 20 notifies the stage control system 19 that the target position in the scanning exposure related to the alignment of the wafer $_+W$ in the Z direction is $Z_2(=Z_1+\Delta Z)$. That is to say notifies the stage control system 19 that the focus offset should be controlled to a predetermined value ($=F_0+\Delta Z$). To continue, in subroutine 204, with the movement direction of the wafer $_+W$ during scanning exposure as the +Y direction, the pattern formed in the reticle $R_T$ is transferred to the block area $SA_1$ of the wafer $_+W$.

After this, in step 241, measurement of the transfer patterns related to the target positions $Z_i(i=3\sim n)$ is successively executed until judged that pattern transfer has been completed for the target positions related to the alignment of the wafer in the Z direction over the predetermined range. In step 241, when judged that the pattern transfer for the target positions related to the alignment of the wafer in the Z direction has been completed over the predetermined range, control returns to the main routine.

Next, returning to FIG. 9, in step 230, it is judged if scanning exposure has been completed for all of the block areas $SA_j$. Since up to here only the block area $SA_1$ has been subjected to scanning exposure, it is judged that scanning exposure has not been completed for all of the block areas. Therefore, in step 231, the substrate table 18 is moved by means of the main control unit 20 via the stage control system 19 and the wafer drive unit 21 etc. to the scanning exposure start position for the block area $SA_2$ which is to be scanning exposed next. To continue, in step 229, scanning exposure is performed in relation to the block area $SA_2$ in the same way as for the case of the block area $SA_1$.

Subsequently, until judged in step 230 that scanning exposure has been completed for all of the block areas, scanning exposure is successively executed in relation to the block areas $SA_j(j=3\sim m)$. In this way, the pattern formed on the reticle $R_T$ is transferred to all surfaces of the surface to be exposed of the wafer $_+W$, for the case where in the scanning exposure the target positions related to the alignment of the wafer in the Z direction are $Z_1\sim Z_n$. That is to say, the rhombic patterns are transferred to the respective positions $(X_{pi}, Y_{pi})$ for each block area $SA_j$ of the surface to be exposed of the wafer $_+W$. Here as described above, the mutual disagreement of the position $(X_{pi}, Y_{pi})$ in the case where the p value is fixed, is sufficiently smaller than the desired positional resolution, and hence hereunder the centroid of the respective positions $(X_{pi}, Y_{pi})$ are expressed by the notation for the position $(X_p, Y_p)$, and the respective positions $(X_{pi}, Y_{pi})$ are also referred to as the peripheral positions of the position $(X_p, Y_p)$.

In step 230, when judged that scanning exposure has been completed for all of the block areas, then in subroutine 232, the size of the rhombic patterns transferred to the respective positions $(X_{pi}, Y_{pi})$ of the wafer +W, that is to say the lengths $_+L_1(X_p, Y_p)$ $(=_+L(X_{pi}, Y_{pi}))$ of the diagonal lines in the predetermined direction of the respective rhombic patterns are measured, and the first reference information is collected. FIG. 11 shows the flow chart for the subroutine 232.

With the subroutine 232, at first in step 245, the wafer $_+W$ is unloaded from the substrate table 18. To continue, in step 246 the wafer $_+W$ is developed. After this, in step 247, the wafer $_+W$ is loaded onto the stage of a pattern length measuring apparatus. For the pattern length measuring apparatus, then as with the first embodiment, an alignment detection system of the off axis form provided in the scanning type exposure apparatus 100 may be used, or measurement may be performed with a different apparatus such as a scanning electron microscope.

Then in step 248, the stage is moved so that the position to be observed of the wafer $_+W$ becomes position $(X_{p1}, Y_{p1})$. In the case where the alignment detection system of the off axis form provided in the scanning type exposure apparatus 100 is used, this movement is preformed by the main control unit 20 via the stage control system 19 and the wafer drive unit 21. To continue, in step 249, the developed wafer $_+W$ is inspected, and the lengths $_+L_1(X_p, Y_p)$ of the diagonal lines in the predetermined direction of the respective rhombic patterns measured and stored.

Then in step 250 it is judged if measurement has been completed for the target position related to the alignment of the wafer in the Z direction over the predetermined range. Since up to here, measurement has only been completed for the target position $Z_1$, it is judged that measurement has not been completed for the target positions related to the alignment of the wafer in the Z direction over the predetermined range. Then in step 251, the stage is moved so that the position to be observed of the wafer $_+W$ becomes the position $(X_{p2}, Y_{p2})$. Then in step 249, the developed wafer $_+W$ is inspected, and the lengths $_+L_2(X_p, Y_p)$ of the diagonal lines in the predetermined direction of the respective rhombic patterns measured and stored.

After this, in step 250, measurement of the transfer pattern in the block area $SA_1$ related to the target positions $Z_i$(i= 3~n) is successively executed until judged that measurement has been completed for the target positions related to the alignment of the wafer in the Z direction over the predetermined range.

In step 250, when judged that measurement of the transfer pattern related to the predetermined Z range has been completed, then in step 252, the best target position $_+Z_B(X_p, Y_p)$ at the position $(X_p, Y_p)$ is obtained as follows. At first, a change in the length $_+L_1(X_1, Y_1)$ due to changing the target position Z is examined. Then, by obtaining the Z value where for example the length $_+L_1(X_p, Y_p)$ becomes a maximum, this Z value is obtained as the best target position $_+Z_B(X_p, Y_p)$ at the position $(X_p, Y_p)$ inside the wafer. In this way, the information corresponding to the obtained best target position $_+Z_B(X_p, Y_p)$ is obtained as the first reference information at position $(X_p, Y_p)$, related to the position of the target surface for alignment of the surface to be exposed of the wafer in the optical axis AX direction of the projection optical system PL when the wafer is scanning exposed while moving the substrate table 18 along the +Y direction, and is stored in the storage device 50.

Then in step 253, it is judged if all of the transfer patterns inside the block area $SA_1$ have been measured and the first reference information obtained. Since up to here only the first reference information for one position has been obtained, then in step 254, the position $(X_p, Y_p)$ is updated to the next position and the first reference information for this position is obtained in similar manner to above, and stored in the storage device 50.

After this, in step 253, the first reference information is obtained for the respective positions inside the block area $SA_1$ and stored in the storage device 50, until judged that all of the transfer patterns inside the block area $SA_1$ have been measured and the first reference information obtained. Then in step 253, when judged that all of the transfer patterns inside the block area $SA_1$ have been measured and the first reference information obtained, then in step 255, the wafer $_+W$ is unloaded from the stage of the pattern length measuring apparatus, and control returns to the main routine.

In this way, when the measurement for the first reference information 52 for the case where the movement direction of the wafer during the scanning exposure is the +Y direction is completed, an operation the same as for the case of the +Y direction is performed using a wafer $_-W$ with the movement direction of the wafer during the scanning exposure in the −Y direction (steps 233~238 in FIG. 9), to obtain the best target position $_-Z_B(X_p, Y_p)$. The information corresponding to the best target position $_-Z_B(X_p, Y_p)$ obtained in this way is stored in the storage device 50 as second reference information 54 related to the target position for alignment of the surface to be exposed of the wafer in the optical axis AX direction of the projection optical system PL at the time of scanning exposure of the wafer while moving the substrate table 18 along the −Y direction.

Here, the first reference information 52 and the second reference information 54 may be obtained by performing a similar process to the first embodiment.

With the above, the collection of the first reference information 52 and the second reference information 54 for the movement mode of the reticle R and the movement mode of the wafer W the same as at the time of device manufacture, is completed. Then for the case of the device manufacture, as with the first embodiment, in the simultaneous movement of the reticle R and the wafer W, the main control unit 20 drive controls the substrate table 18 in the Z-axis direction and the incline direction via the stage control system 19 and the wafer drive unit 21 based on the first reference information 52, the second reference information 54 and the Z position information for the wafer W detected by the multi-point focus position detection system (40, 42), to thereby perform surface position adjustment (setting the alignment surface), and modifies the image formation surface by means of the projection optical system PL via the image formation characteristic correction controller 68 to thereby effect scanning exposure. As a result, during scanning exposure the area to be exposed of the wafer W is maintained as the best focus surface so that pattern transfer with excellent exposure accuracy is executed.

Third Embodiment

As follows is a description of a scanning type exposure apparatus and a scanning exposure method according to a third embodiment of the present invention, with reference to FIG. 13 through FIG. 15. This embodiment, compared to the first embodiment, has the characteristic in the point that only one measurement wafer is used in the collection of the first reference information and the second reference information. In the following description, similar components are denoted by the same symbol and repeated description thereof is omitted.

The scanning type exposure apparatus of this embodiment, as with the first embodiment, is one where the wafer W serving as the sensitive substrate is moved in the +Y direction and the −Y direction during scanning exposure, and the reticle R serving as the mask is simultaneously moved with the wafer W to perform scanning exposure. This has the same construction as the scanning type exposure apparatus shown in FIG. 1.

As follows is a description of the scanning exposure method of this embodiment, using the abovementioned scanning type exposure apparatus 100.

At first, collection of the first reference information 52 related to target information for alignment of the surface to be exposed of the wafer W in the Z direction (optical axis AX direction) at the time of scanning exposure while moving the substrate table 18 along the +Y direction, and of the second reference information 54 related to target information for alignment of the surface to be exposed of the wafer W in the Z direction at the time of scanning exposure while moving the substrate table 18 along the −Y direction, is performed. This reference information collection, is performed based on the theory of the method for obtaining the reference information as described for the first embodiment with reference to FIG. 3.

Figure 15:
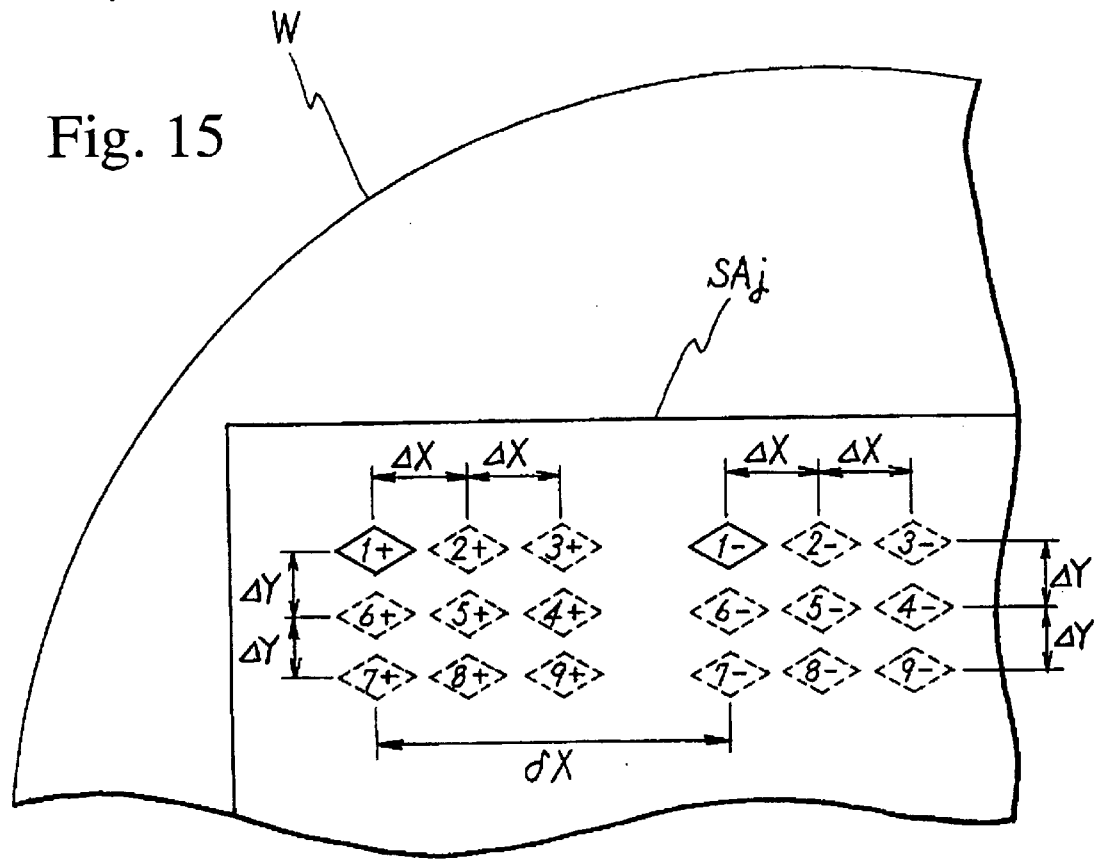
FIG. 15 is a diagram for explaining a transfer pattern at the time of collection of the first reference information and the second reference information in the third embodiment.
Figure 13:
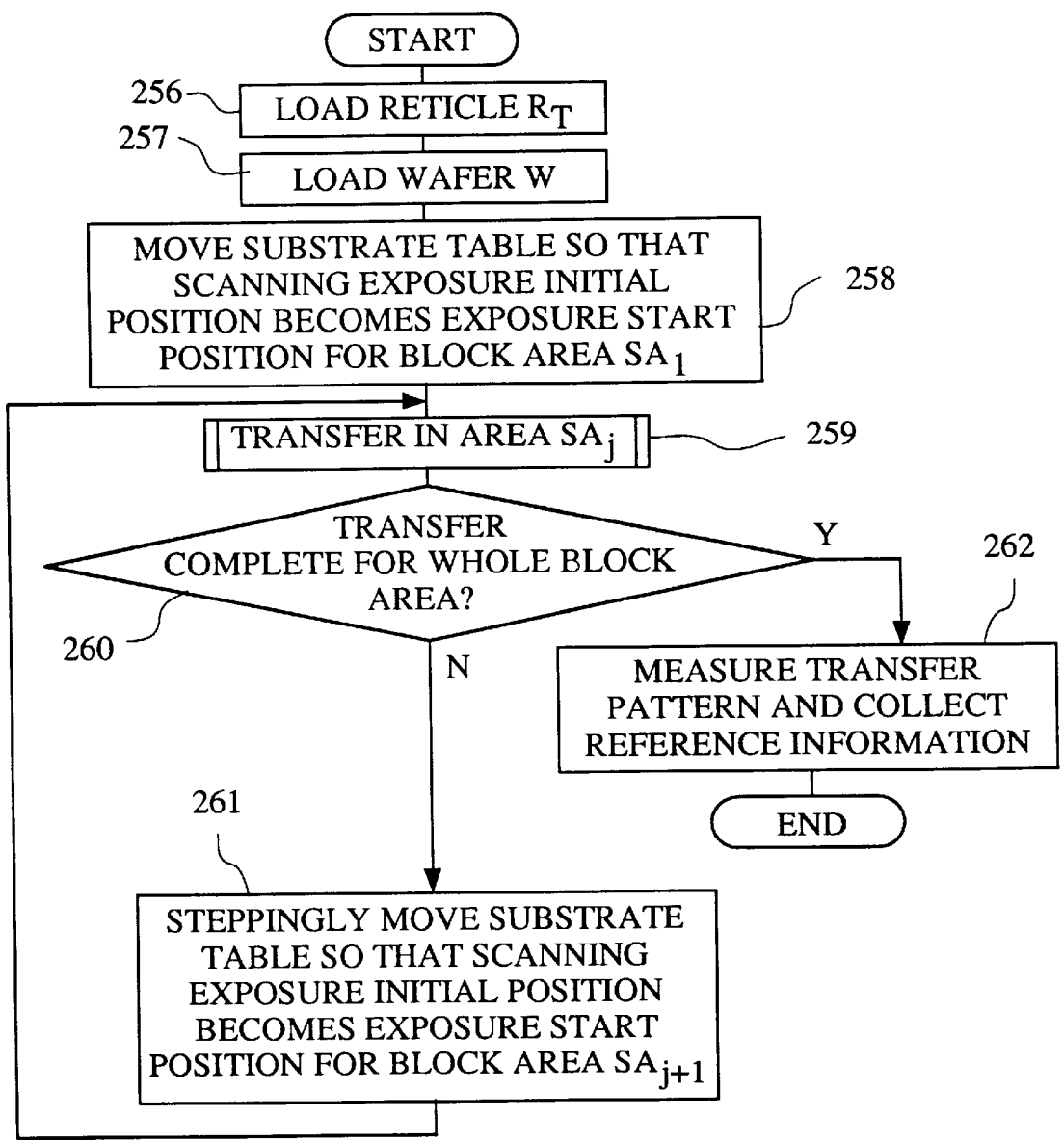
FIG. 13 is a flow chart for a collection process for first reference information and second reference information in a scanning exposure method of a third embodiment.
Figure 14:
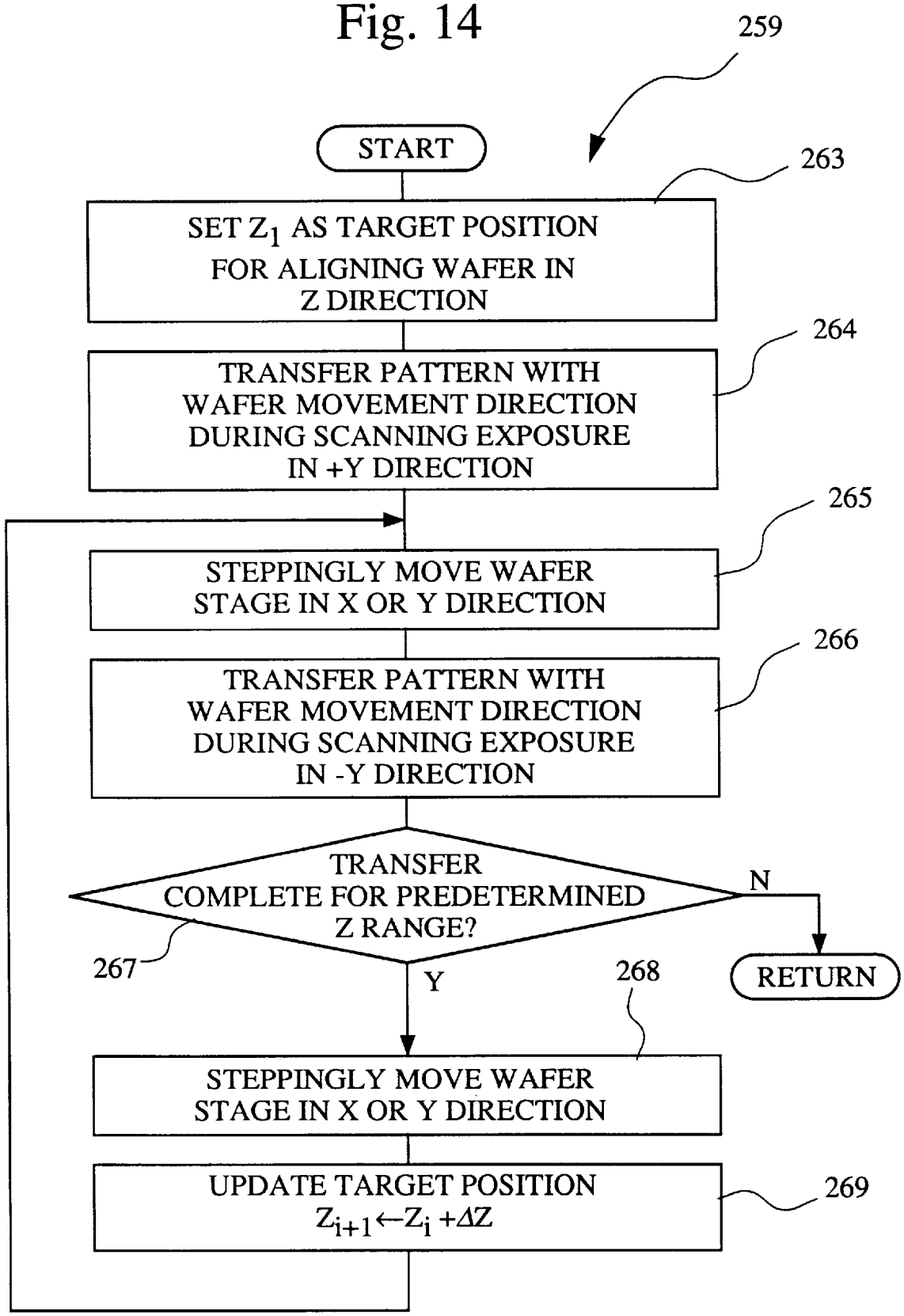
FIG. 14 is a flow chart for the process of a subroutine 259 in FIG. 15.

Hereunder referring to FIG. 13 through FIG. 15, is a description of the collection method for the first reference information 52 and the second reference information 54 in this embodiment. FIG. 13 and FIG. 14 show a flow chart for the collection of the first reference information 52 and the second reference information 54 in this embodiment.

At first, in step 256 of FIG. 13, a reference information collection reticle $R_T$ is loaded onto a reticle stage RST by means of a reticle loader (not shown in the figures), as with the first embodiment. To continue, in step 257, a wafer W for reference information collection is loaded onto the substrate table 18 by means of a wafer loader (not shown in the figures).

Then, in step 258, the substrate table 18 is moved to the scanning exposure initial position of an area $SA_1$ inside a block area $SA_j$(j=1~m) of the surface to be exposed of the wafer W. This movement is performed, as with the second embodiment, by the main control unit 20 via the stage control system 19 and the wafer drive unit 21 etc. Here, as with the first embodiment, the respective block areas $SA_j$ coincide with the respective shot areas at the time of device manufacture. To continue, in subroutine 259, with the movement direction of the wafer W at the time of scanning exposure as the +Y direction and the −Y direction, then while changing the target position related to the alignment of the wafer in the Z direction over a predetermined range, the pattern formed on the reticle $R_T$ is transferred to inside the block area $SA_1$ of the wafer W for each respective target position $Z_i$(i=1~n).

FIG. 14 shows a flow chart for the subroutine 259. With the subroutine 259, at first in step 263, the main control unit 20 notifies the stage control system 19 that the target position in the scanning exposure related to the alignment of the wafer W in the Z direction is $Z_1$. That is to say notifies the stage control system 19 that the focus offset should be controlled to a predetermined value (=$F_0$). To continue, in step 264, with the movement direction of the wafer W during scanning exposure as the +Y direction, the reticle $R_T$ and the wafer W are synchronously moved as described beforehand with reference to FIG. 2, to execute scanning exposure for the block area $SA_1$ of the surface to be exposed of the wafer W. With this scanning exposure, as with the first embodiment, based on a detection signal from the multi-point focus position detection system (40, 42), the substrate table 18 is drive controlled in the Z-axis direction by means of the main control unit 20 via the stage control system 19 and the wafer drive unit 21 so that the alignment target position in the Z-axis direction becomes $Z_1$, and is drive controlled in the incline direction, thereby performing adjustment of the surface position (setting of the alignment surface).

Next, in step 265, the wafer W is steppingly moved in the X direction or the Y direction (including the X direction and the Y direction) so that a new rhombic pattern is transferred by the subsequent scanning exposure to the peripheral area of the rhombic patterns transferred up until the previous time, such that the rhombic pattern transferred by the subsequent pattern transfer does not overlap the rhombic patterns transferred by the pattern transfers up until the previous time. This movement is performed by the main control unit 20 via the stage control system 19 and the wafer drive unit 21 etc. FIG. 15 shows an example of this fine movement. FIG. 15 shows the case for where the target position related to the alignment of the wafer in the Z direction is changed from $Z_1$~$Z_9$. The areas to which the rhombic patterns corresponding to the target positions $Z_i$ are transferred are denoted by (ik) (k=+ or −: corresponding to the movement direction of the wafer W), and extraction lines are omitted. As shown in FIG. 15, the transfer areas for the rhombic patterns corresponding to the respective target positions $Z_i$, are arranged at a pitch of $\Delta X$ in the X direction and at a pitch of $\Delta Y$ in the Y direction, for the same movement direction of the wafer, and are separated by $\delta X$ in the case where the movement directions of the wafer differ. This $\Delta X$ and $\Delta Y$ is set slightly larger than the expected maximum value related to the X direction and Y direction of the rhombic patterns to be transferred, and $\delta X$ is set more than three times larger than $\Delta X$. Here the $\Delta X$, $\delta X$ and the $\Delta Y$ are sufficiently smaller than the desired positional resolution related to the X direction and the Y direction. Moreover, in the case of FIG. 15, the amount of the stepping movement performed in step 265 becomes the $\delta X$ in the X-axis direction.

To continue, in step 266, the movement direction of the wafer W during scanning exposure is made the −Y direction, and the reticle $R_T$ and the wafer W are synchronously moved as described beforehand with reference to FIG. 2, to execute scanning exposure for the block area $SA_1$ of the surface to be exposed of the wafer W. With this scanning exposure, based on a detection signal from the multi-point focus position detection system (40, 42), the substrate table 18 is drive controlled in the Z-axis direction as with the first embodiment, by means of the main control unit 20 via the stage control system 19 and the wafer drive unit 21 so that the alignment target position in the Z-axis direction becomes $Z_1$, and is drive controlled in the incline direction, thereby performing adjustment of the surface position (setting of the alignment surface).

Then returning to FIG. 14, in step 267 it is judged if measurement has been completed for the target position related to the alignment of the wafer in the Z direction over a predetermined range. Since up to here, pattern transfer has only been completed for the target position $Z_1$, it is judged that pattern transfer has not been completed for the target position related to the alignment of the wafer in the Z direction over the predetermined range. Then in step 268, the wafer W is steppingly moved in the X direction or the Y direction (including the X direction and the Y direction) so that a new rhombic pattern is transferred by the subsequent scanning exposure, to the peripheral region of the rhombic patterns transferred up until the previous time, such that the rhombic pattern transferred by the subsequent pattern transfer does not overlap the rhombic patterns transferred by the pattern transfers up until the previous time. This movement is performed by the main control unit 20 via the stage control system 19 and the wafer drive unit 21 etc. Here in the case of FIG. 15, the amount of stepping movement performed in step 268 becomes ($\delta X-\Delta X$) in the X-axis direction, and becomes $\Delta Y$ as required for the Y-axis direction.

Next, in step 269, the main control unit 20 notifies the stage control system 19 that the target position in the scanning exposure related to the alignment of the wafer W in the Z direction is $Z_2$(=$Z_1$+$\Delta Z$). That is to say notifies the stage control system 19 that the focus offset should be controlled to a predetermined value (=$F_0$+$\Delta Z$). To continue, in step 264 through step 268, with the movement direction of the wafer W during scanning exposure as the +Y direction and the −Y direction, the pattern formed in the reticle $R_T$ is transferred to the block area $SA_1$ of the wafer W.

After this, in step 267, pattern transfer related to the target positions $Z_j$(j=3~n) is successively executed until judged that pattern transfer has been completed for the target positions related to the alignment of the wafer in the Z direction over the predetermined range. In step 267, when judged that the pattern transfer for the target positions related to the alignment of the wafer in the Z direction has been completed over the predetermined range, control returns to the main routine.

Next, returning to FIG. 13, in step 260, it is judged if scanning exposure has been completed for all of the block areas $SA_j$. Since up to here only the block area $SA_1$ has been subjected to scanning exposure, it is judged that scanning exposure has not been completed for all of the block areas. Therefore, in step 261, the substrate table 18 is moved by means of the main control unit 20 via the stage control system 19 and the wafer drive unit 21 etc. to the scanning exposure start position for the block area $SA_2$ which is to be scanning exposed next. To continue, in subroutine 259, scanning exposure is performed in relation to the block area $SA_2$ in the same way as for the case of the block area $SA_1$.

Subsequently, until judged in step 260 that scanning exposure has been completed for all of the block areas, scanning exposure is successively executed in relation to the block areas $SA_j$(j=3~m). In this way, the pattern formed on the reticle $R_T$ is transferred to all surfaces of the surface to be exposed of the wafer W, for the case where in the scanning exposure, the target positions related to the alignment of the wafer in the Z direction are $Z_1$~Zn. That is to say, the rhombic patterns are transferred to the respective positions $(X_{pik}, Y_{pik})$ for each block area $SA_j$ of the surface to be exposed of the wafer W. Here as described above, the mutual disagreement of the position $(X_{pik}, Y_{pik})$ in the case where the p value is fixed, is sufficiently smaller than the desired positional resolution, and hence hereunder the centroid of the respective positions $(X_{pik}, Y_{pik})$ are expressed by the notation for the position $(X_p, Y_p)$, and the respective positions $(X_{pik}, Y_{pik})$ are also referred to as the peripheral positions of the position $(X_p, Y_p)$.

In step 260, when judged that scanning exposure has been completed for all of the block areas, then in step 262, the size of the rhombic patterns transferred to the respective positions $(X_{pik}, Y_{pik})$ of the wafer W, that is to say the lengths $_kL_1(X_p, Y_p)$ $(=L(X_{pik}, Y_{pik}))$ of the diagonal lines in the predetermined direction of the respective rhombic patterns are measured, and the first reference information 52 and the second reference information 54, as with the second embodiment, is collected in the following manner.

At first, the wafer W is unloaded from the substrate table 18, developed, and then loaded onto the stage of a pattern length measuring apparatus. For the pattern length measuring apparatus, then as with the first embodiment, an alignment detection system of the off axis form provided in the scanning type exposure apparatus 100 may be used, or measurement may be performed with a different apparatus such as a scanning electron microscope.

Then with the observation position, the stage is moved so that the position to be observed of the wafer W becomes position $(X_{p1+}, Y_{p1+})$. In the case where the alignment detection system of the off axis form provided in the scanning type exposure apparatus 100 is used, this movement is preformed by the main control unit 20 via the stage control system 19 and the wafer drive unit 21. To continue, in step 249, the developed wafer W is inspected, and the lengths $+L_1(X_p, Y_p)$ of the diagonal lines in the predetermined direction of the rhombic patterns measured and stored.

Then the stage is successively moved to the positions $(X_{pi+}, Y_{pi+})$ (i=2~n), and each time the lengths $+L_1(X_p, Y_p)$ of the diagonal lines in the predetermined direction of the respective rhombic patterns are measured and stored. To continue, by obtaining the Z value for where the length $+L_i(X_p, Y_p)$ becomes a maximum, this Z value is obtained as the best target position $+Z_B(X_p, Y_p)$ at the position $(X_p, Y_p)$ inside the wafer. In this way, the information corresponding to the obtained best target position $+Z_B(X_p, Y_p)$ is obtained as the first reference information at position $(X_p, Y_p)$, related to the position of the target surface for alignment of the surface to be exposed of the wafer W in the optical axis AX direction of the projection optical system PL when the wafer W is scanning exposed while moving the substrate table 18 along the +Y direction, and is stored in the storage device 50. After this in the same way, the first reference information for the respective positions inside the block area $SA_1$ are obtained and stored in the storage device 50.

Then with the observation position, the stage is moved so that the position to be observed of the wafer W becomes position $(X_{p1-}, Y_{p1-})$. To continue, the developed wafer W is observed, and the lengths $-L1 (X_p, Y_p)$ of the diagonal lines in the predetermined direction of the rhombic patterns are measured and stored.

Then the stage is successively moved to the positions $(X_{pi-}, Y_{pi-})$ (i=2~n), and each time the lengths $-Li (X_p, Y_p)$ of the diagonal lines in the predetermined direction of the respective rhombic patterns are measured and stored. To continue, by obtaining the Z value for where the length $-Li (X_p, Y_p)$ becomes a maximum, this Z value is obtained as the best target position $_-Z_B(X_p, Y_p)$ at the position $(X_p, Y_p)$ inside the wafer. In this way, the information corresponding to the obtained best target position $_-Z_B(X_p, Y_p)$ is obtained as the second reference information at position $(X_p, Y_p)$, related to the position of the target surface for alignment of the surface to be exposed of the wafer W in the optical axis AX direction of the projection optical system PL when the wafer W is scanning exposed while moving the substrate table 18 along the $-Y$ direction, and is stored in the storage device 50. After this in the same way, the second reference information for the respective positions inside the block area $SA_1$ are obtained and stored in the storage device 50.

Then, as with the case of the block area $SA_1$, the first reference information and the second reference information for the block areas $SA_j$(j=2~m) is obtained and stored in the storage device 50.

With the above, the collection of the first reference information 52 and the second reference information 54 for the movement mode of the reticle R and the movement mode of the wafer W the same as at the time of device manufacture, is completed. Then for the case of the device manufacture, as with the first embodiment, in the simultaneous movement of the reticle R and the wafer W, the main control unit 20 drive controls the substrate table 18 in the Z-axis direction and the incline direction via the stage control system 19 and the wafer drive unit 21 based on the first reference information 52, the second reference information 54 and the Z position information for the wafer W detected by the multi-point focus position detection system (40, 42), to thereby perform surface position adjustment (setting the alignment surface), and modifies the image formation surface by means of the projection optical system PL via the image formation characteristic correction controller 68 to thereby effect scanning exposure. As a result, during scanning exposure the area to be exposed of the wafer W is maintained as the best focus surface so that ideal pattern transfer is executed.

The present invention is not limited to the above embodiments, and changes are possible. For example, in the case where there is a change in the movement speed of the substrate table 18 in the scanning exposure, then ideally the collection of the abovementioned best target positions $kZ_B$ (X, Y) is performed for each of the various wafer W movement speeds V to obtain the best target positions $kZ_B$(X, Y, Z), and the first reference information and the second reference information are then obtained from these best target positions $kZ_B$(X, Y, Z).

Furthermore, in the case where there are three or more types of movement direction for the wafer W during the scanning exposure, then ideally the reference information is obtained corresponding to the respective directions for each respective direction.

Furthermore, the shape of the pattern used in the collection of the reference information is not limited to a rhombic shape, and an optional shape can be adopted. However, it is preferable to adopt a shape where a measurement position of an inherent characteristic length of the shape can be easily specified.

Moreover, with the abovementioned embodiments, the wafer is driven along the optical axis direction of the projection optical system in accordance with the reference information. However the reticle may be driven along the optical axis direction of the projection optical system.

Furthermore, for the exposure light of the wafer W, normally a plurality of reticles are used. However first reference information and second reference information may be determined for each reticle.

What is claimed is:

1. A scanning exposure method in which a pattern formed on a mask is transferred onto a sensitive substrate by means of a projection system while synchronously moving said mask and said sensitive substrate, said method comprising:

changing a target surface for alignment of a surface to be exposed of said sensitive substrate in accordance with a condition of synchronous movement of at least one of said mask and said sensitive substrate; and adjusting a position of the surface to be exposed of said sensitive substrate so as to align the surface to be exposed of said sensitive substrate with a changed target surface, during the synchronous movement for scanning exposure.

2. A scanning exposure method according to claim 1, wherein said scanning exposure is performed while adjusting an incline of said sensitive substrate.

3. A scanning exposure method according to claim 1, wherein said condition of the synchronous movement includes at least one of a synchronous movement direction and a synchronous movement speed of said mask.

4. A scanning exposure method according to claim 1, wherein said condition of the synchronous movement includes at least one of a synchronous movement direction and a synchronous movement speed of said sensitive substrate.

5. A scanning exposure method according to claim 1, wherein information on said target surface is stored corresponding to a position of said mask in a synchronous movement direction.

6. A scanning exposure method according to claim 1, wherein information on said target surface is stored corresponding to a position of said substrate in a synchronous movement direction.

7. A scanning exposure method according to claim 1, wherein information for performing said change in accordance with the condition of the synchronous movement is collected prior to exposing said sensitive substrate.

8. A scanning exposure method according to claim 7, wherein said collected information is reference information related to the target surface for each synchronous movement direction of said mask.

9. A scanning exposure method according to claim 8, wherein predetermined mask is moved in each of said synchronous movement directions while projecting a projection image of a pattern of said predetermined mask, and information related to the projection image is obtained for each of a plurality of positions in an optical axis direction of the projection system, and said reference information for each of said synchronous movement directions is determined based on the obtained information related to the projection image.

10. A scanning exposure method according to claim 9, wherein a plurality of predetermined patterns are formed on said predetermined mask along the synchronous movement direction of said mask.

11. A scanning exposure method according to claim 9, wherein the information related to the projection image of the pattern of said predetermined mask is obtained by transferring the pattern of said predetermined mask onto a predetermined substrate for each of the plurality of positions in the optical axis direction, and measuring the pattern which has been transferred onto said predetermined sensitive substrate.

12. A scanning exposure method according to claim 11, wherein the transfer of the pattern of said predetermined mask to said predetermined sensitive substrate, is performed by moving said predetermined sensitive substrate in synchronous with said predetermined mask at each of the plurality of positions in the optical axis directions of said projection system.

13. A scanning exposure method according to claim 8, wherein said synchronous movement directions include a first direction and a second direction opposite to said first direction.

14. A scanning exposure method in which a pattern formed on a mask is transferred onto a sensitive substrate by means of a projection system while synchronously moving said mask and said sensitive substrate, said method comprising:

adjusting an image formation surface of a pattern image in accordance with a condition of synchronous movement of at least one of said mask and said sensitive substrate; and adjusting a position of the surface to be exposed of said sensitive substrate so as to align the image formation surface of the pattern image with the surface to be exposed of said sensitive substrate, during the synchronous movement for scanning exposure.

15. A scanning exposure method according to claim 14, wherein said scanning exposure is performed while adjusting an incline of said sensitive substrate.

16. A scanning exposure method according to claim 14, wherein said condition of the synchronous movement includes at least one of a synchronous movement direction and a synchronous movement speed of said mask.

17. A scanning exposure method according to claim 14, wherein said condition of the synchronous movement includes at least one of a synchronous movement direction and a synchronous movement speed of said sensitive substrate.

18. A scanning exposure method according to claim 14, wherein information for performing said adjustment in accordance with the condition of the synchronous movement, is collected prior to exposing said sensitive substrate.

19. A scanning exposure method according to claim 18, wherein said information is collected by performing a scanning exposure of a predetermined sensitive substrate with a predetermined mask at each of a plurality of positions in an optical axis direction of the projection system.

20. A scanning exposure method according to claim 14, wherein the image formation surface is adjusted for synchronous movement directions, and wherein said synchronous movement directions include a first direction and a second direction opposite to said first direction.

* * * * *